United States Patent
Ko et al.

(10) Patent No.: US 8,648,404 B2
(45) Date of Patent: Feb. 11, 2014

(54) NONVOLATILE SEMICONDUCTOR MEMORY DEVICE, THREE-DIMENSIONAL SEMICONDUCTOR DEVICE, AND METHOD OF MANUFACTURING THE SAME

(75) Inventors: Nikka Ko, Yokkaichi (JP); Katsunori Yahashi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 13/298,664

(22) Filed: Nov. 17, 2011

(65) Prior Publication Data

US 2012/0319173 A1 Dec. 20, 2012

(30) Foreign Application Priority Data

Jun. 15, 2011 (JP) .................................. 2011-133591

(51) Int. Cl.
*H01L 29/792* (2006.01)
*H01L 21/8247* (2006.01)

(52) U.S. Cl.
USPC .... 257/314; 257/324; 257/401; 257/E21.158; 257/E27.046; 257/E29.309; 257/E21.679; 257/E21.645; 438/640

(58) Field of Classification Search
USPC .......... 257/314, 324, 401, E29.309, E21.158, 257/E27.046, E21.679, E21.645; 438/640
See application file for complete search history.

(56) References Cited

U.S. PATENT DOCUMENTS

| 7,799,673 | B2 | 9/2010 | Arai et al. | |
|---|---|---|---|---|
| 7,936,004 | B2 | 5/2011 | Kito et al. | |
| 7,989,880 | B2 * | 8/2011 | Wada et al. | 257/329 |
| 8,169,016 | B2 * | 5/2012 | Higashi | 257/314 |
| 8,228,733 | B2 * | 7/2012 | Tokiwa et al. | 365/185.11 |
| 8,426,908 | B2 * | 4/2013 | Higashi | 257/324 |
| 8,431,969 | B2 * | 4/2013 | Kim et al. | 257/211 |
| 8,476,713 | B2 * | 7/2013 | Lee et al. | 257/368 |
| 2011/0249498 | A1 * | 10/2011 | Tokiwa et al. | 365/185.05 |
| 2011/0256672 | A1 * | 10/2011 | Wada et al. | 438/128 |
| 2012/0119283 | A1 * | 5/2012 | Lee et al. | 257/316 |
| 2012/0193705 | A1 * | 8/2012 | Lim et al. | 257/330 |
| 2013/0075802 | A1 * | 3/2013 | Chen et al. | 257/314 |

* cited by examiner

*Primary Examiner* — Evan Pert
(74) *Attorney, Agent, or Firm* — Oblon, Spivak, McClelland, Maier & Neustadt, L.L.P.

(57) ABSTRACT

A three-dimensional semiconductor device includes a semiconductor substrate, a plurality of conductive layers and insulating layers, and a plurality of contacts. The plurality of conductive layers and insulating layers are stacked alternately above the semiconductor substrate. The plurality of contacts extend in a stacking direction of the plurality of conductive layers and insulating layers. The plurality of conductive layers form a stepped portion having positions of ends of the plurality of conductive layers gradually shifted from an upper layer to a lower layer. The plurality of contacts are connected respectively to each of steps of the stepped portion. The stepped portion is formed such that, at least from an uppermost conductive layer to a certain conductive layer, the more upwardly the conductive layer is located, the broader a width of the step is.

20 Claims, 26 Drawing Sheets

NONVOLATILE SEMICONDUCTOR MEMORY DEVICE, THREE-DIMENSIONAL SEMICONDUCTOR DEVICE, AND METHOD OF MANUFACTURING THE SAME

CROSS-REFERENCE TO RELATED APPLICATIONS

This application is based upon and claims the benefit of priority from the prior Japanese Patent Application No. 2011-133591, filed on Jun. 15, 2011, the entire contents of which are incorporated herein by reference.

FIELD

Embodiments described in the present specification relate to a nonvolatile semiconductor memory device having a stacking structure, a three-dimensional semiconductor device, and a method of manufacturing the same.

BACKGROUND

One example of a three-dimensional semiconductor device proposed in recent years is a semiconductor memory device having memory cells disposed three-dimensionally for increasing a degree of integration of memory (three-dimensional type semiconductor memory device).

In the above-described three-dimensional type semiconductor memory device, ends of conductive layers (word lines and so on) connected to gates of memory cells configure a stepped portion processed in a stepped shape. Moreover, contacts are formed on upper surfaces of the conductive layers in this stepped portion.

However, it sometimes occurs that the conductive layers and the contacts cannot be sufficiently connected due to variations in manufacturing processes, and there is a consequent risk that line resistance in the three-dimensional semiconductor device increases.

DETAILED DESCRIPTION

A three-dimensional semiconductor device according to an embodiment includes a semiconductor substrate, a plurality of conductive layers and insulating layers, and a plurality of contacts. The plurality of conductive layers and insulating layers are stacked alternately above the semiconductor substrate. The plurality of contacts extend in a stacking direction of the plurality of conductive layers and insulating layers. The plurality of conductive layers form a stepped portion having positions of ends of the plurality of conductive layers gradually shifted from an upper layer to a lower layer. The plurality of contacts are connected respectively to each of steps of the stepped portion. The stepped portion is formed such that, at least from an uppermost conductive layer to a certain conductive layer, the more upwardly the conductive layer is located, the broader a width of the step is.

One embodiment of a nonvolatile semiconductor memory device is described below with reference to the drawings.

First Embodiment

Configuration

Figure 1:
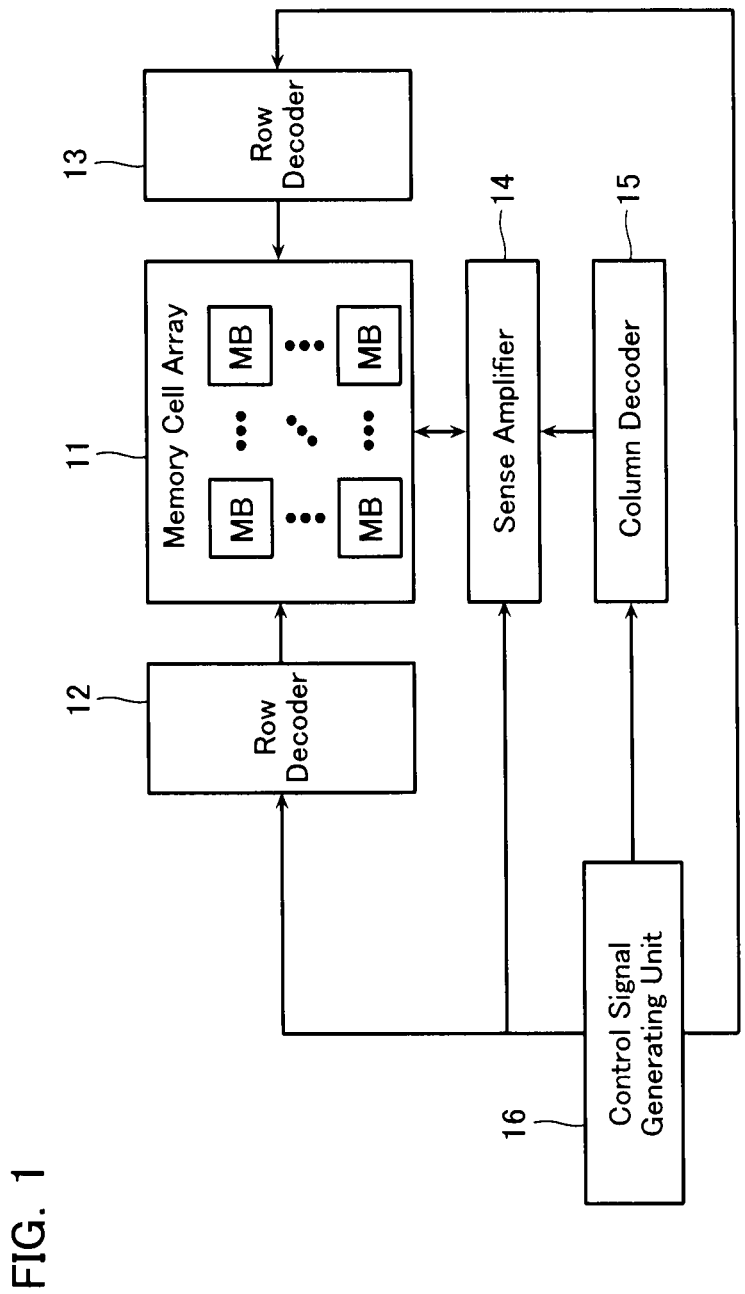
FIG. 1 is a block diagram of a nonvolatile semiconductor memory device according to a first embodiment.

A configuration of a nonvolatile semiconductor memory device according to a first embodiment is described below. FIG. 1 is a block diagram of the nonvolatile semiconductor memory device according to the first embodiment.

As shown in FIG. 1, the nonvolatile semiconductor memory device according to the first embodiment comprises a memory cell array 11, and row decoders 12 and 13, a sense amplifier 14, a column decoder 15, and a control signal generating unit 16 for controlling read and write in this memory cell array 11.

The memory cell array 11 is configured from a plurality of memory blocks MB. Each of the memory blocks MB includes a plurality of memory transistors MTr arranged in a three-dimensional shape and each storing data in a nonvolatile manner. Moreover, each of the memory blocks MB configures a minimum erase unit erased in a batch when a data erase operation is executed. The memory transistors MTr are arranged in a matrix (three-dimensionally) in a row direction, a column direction, and a stacking direction.

As shown in FIG. 1, the row decoders 12 and 13 decode a block address signal and so on downloaded thereto to control the memory cell array 11. The sense amplifier 14 reads data from the memory cell array 11. The column decoder 15 decodes a column address signal to control the sense amplifier 14. The control signal generating unit 16 boosts a reference voltage to generate a high voltage required during write or erase, and, furthermore, generates a control signal to control the row decoders 12 and 13, the sense amplifier 14, and the column decoder 15.

Figure 2:
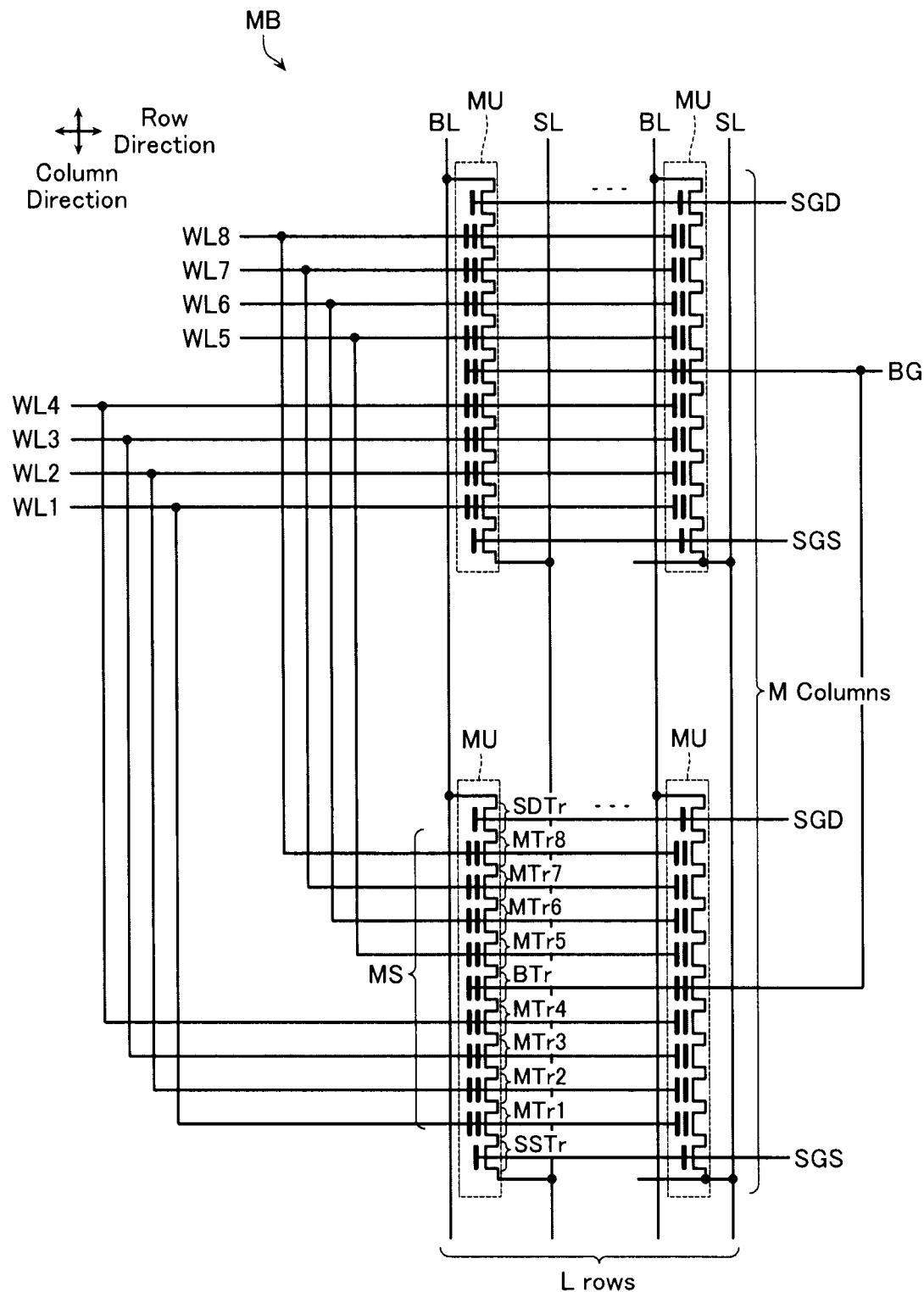
FIG. 2 is a circuit diagram showing a memory block MB according to the first embodiment.

Next, a specific configuration of the memory block MB is described with reference to FIG. 2. The memory block MB includes a plurality of bit lines BL, a plurality of source lines SL, and a plurality of memory units MU connected to these bit lines BL and source lines SL.

The memory units MU configure a NAND type flash memory. Each memory unit MU is configured having a source side select transistor SSTr and a drain side select transistor SDTr connected one to each of the two ends of a memory string MS, the memory string MS including memory transistors MTr1-MTr8 and a back gate transistor BTr connected in series. The memory transistors MTr1-MTr8 have their threshold voltages changed by a charge being stored in their charge storage layers, and retain data corresponding to these threshold voltages.

Drains of the drain side select transistors SDTr in a plurality of memory units MU aligned in the column direction are connected to a common bit line BL. Sources of the source side select transistors SSTr in a plurality of memory units MU aligned in the column direction are connected to a common source line SL. Word lines WL1-WL8 are respectively connected to gates of each of the memory transistors MTr1-MTr8. A back gate line BG is commonly connected to gates of the back gate transistors BTr. Source side select gate lines SGS are connected to gates of the source side select transistors SSTr, and drain side select gate lines SGD are connected to gates of the drain side select transistors SDTr.

Figure 3:
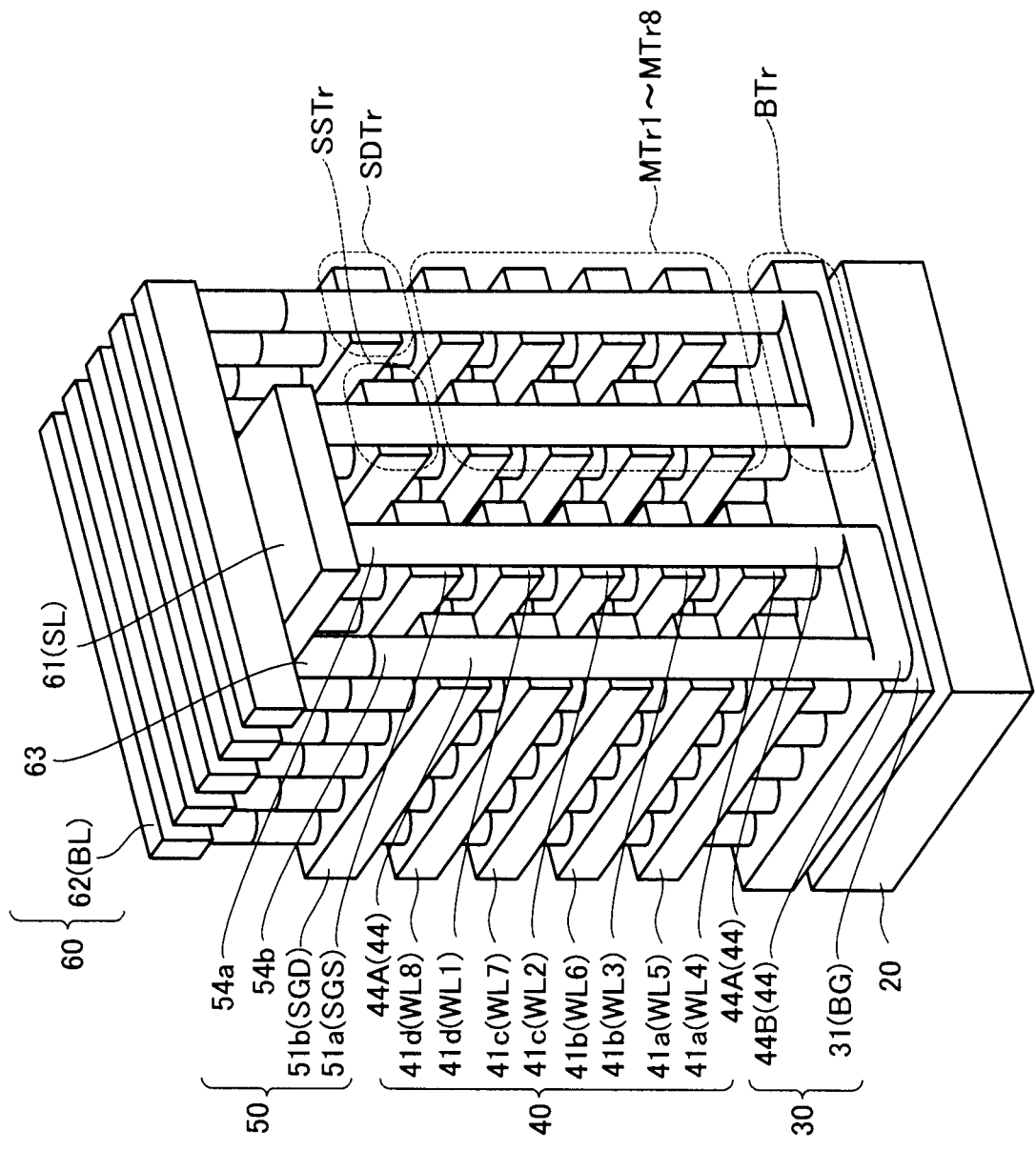
FIG. 3 is a schematic perspective view showing the memory block MB according to the first embodiment.
Figure 4:
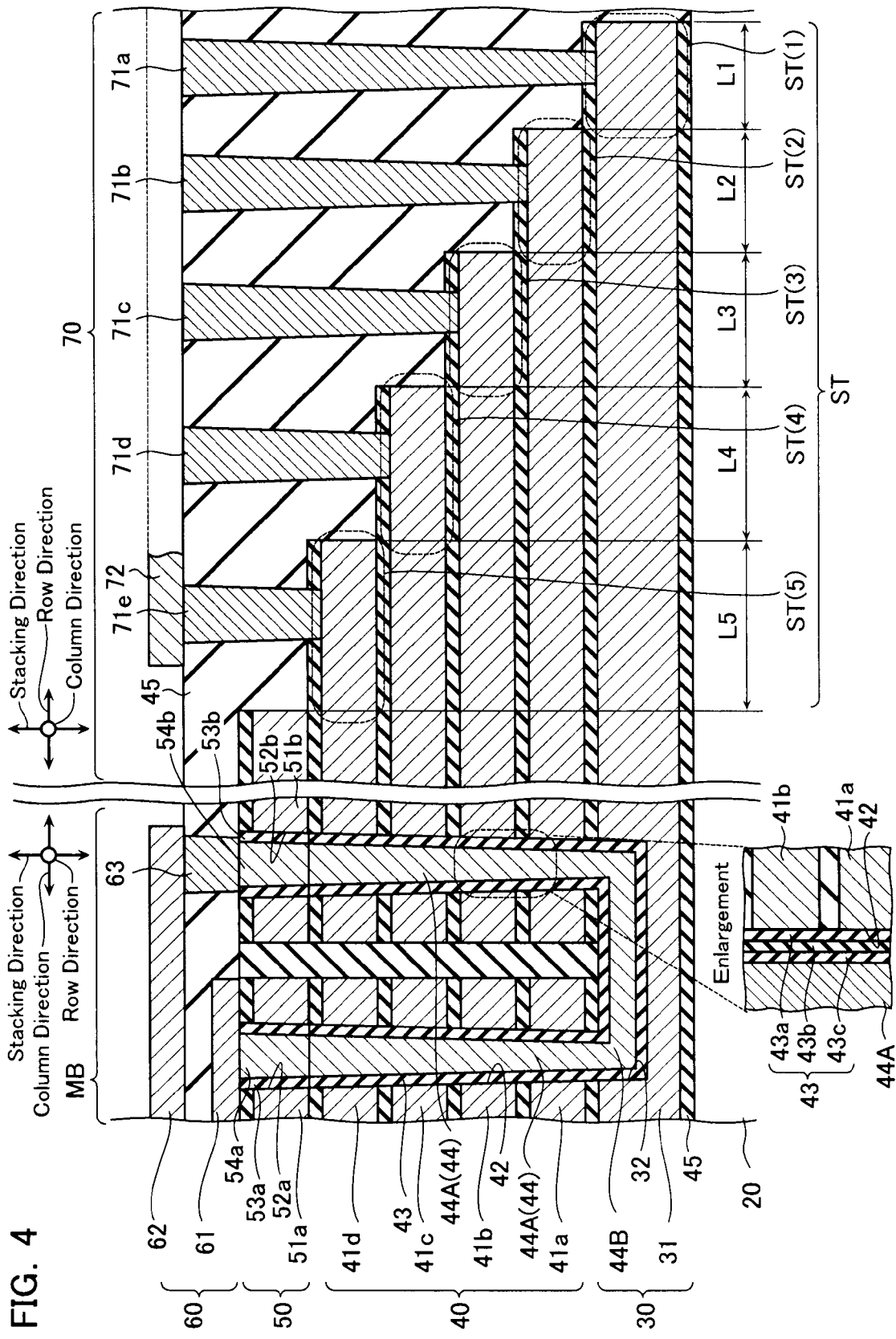
FIG. 4 is a cross-sectional view showing the memory block MB and a word line contact portion 70 according to the first embodiment.

Next, a structure of the memory cell array according to the first embodiment is described with reference to FIGS. 3 and 4. FIG. 3 illustrates part of one memory block MB. Such a memory block MB shares bit lines BL and is formed repeatedly in the column direction. FIG. 4 shows the memory block MB and a word line contact portion 70 located in a periphery of that memory block MB. Note that a left side of FIG. 4 shows a cross-section of the memory block MB as viewed from the row direction, and a right side of FIG. 4 shows a cross-section of the word line contact portion 70 as viewed from the column direction.

As shown in FIGS. 3 and 4, one memory block MB includes, stacked sequentially on a substrate 20, a back gate layer 30, a memory layer 40, a select transistor layer 50, and a wiring layer 60. The back gate layer 30 functions as the back gate transistor BTr. The memory layer 40 functions as the memory transistors MTr1-MTr8. The select transistor layer 50 functions as the drain side select transistor SDTr and the source side select transistor SSTr. The wiring layer 60 functions as the source line SL and the bit line BL.

As shown in FIGS. 3 and 4, the back gate layer 30 includes a back gate conductive layer 31. The back gate conductive layer 31 functions as the back gate line BG and as a gate of the back gate transistor BTr. The back gate conductive layer 31 is formed to extend in a plate shape, two-dimensionally, in the row direction and the column direction parallel to a main surface of the substrate 20. The back gate conductive layer 31 is formed by, for example, polysilicon (poly-Si).

As shown in FIG. 4, the back gate layer 30 includes a back gate hole 32. The back gate hole 32 is formed digging out the back gate conductive layer 31. The back gate hole 32 is formed in a substantially rectangular shape having the column direction as a longer direction as viewed from an upper surface above. The back gate hole 32 is formed in a matrix in the row direction and the column direction in one memory block MB.

As shown in FIGS. 3 and 4, the memory layer 40 is formed in a layer above the back gate layer 30. The memory layer 40 includes four layers of word line conductive layers 41a-41d. The word line conductive layer 41a functions as the word line WL4 and the gate of the memory transistor MTr4. In addition, the word line conductive layer 41a functions as the word line WL5 and the gate of the memory transistor MTr5. Similarly, the word line conductive layers 41b-41d function respectively as the word lines WL3 and WL6, WL2 and WL7, and WL1 and WL8, and the gates of the memory transistors MTr3 and MTr6, MTr2 and MTr7, and MTr1 and MTr8.

The word line conductive layers 41a-41d are stacked having interlayer insulating layers 45 sandwiched between them above and below. The word line conductive layers 41a-41d are formed extending with the row direction (direction perpendicular to plane of paper in FIG. 4) as a longer direction and having a certain pitch in the column direction. The word line conductive layers 41a-41d are formed by, for example, polysilicon (poly-Si).

As shown in FIG. 4, the memory layer 40 includes a memory hole 42. The memory hole 42 is formed penetrating the word line conductive layers 41a-41d and the interlayer insulating layers 45. The memory hole 42 is formed to align with an end vicinity of the back gate hole 32 in the column direction.

In addition, as shown in FIG. 4, the back gate layer 30 and the memory layer 40 include a memory gate insulating layer 43 and a memory semiconductor layer 44. The memory semiconductor layer 44 functions as a body (channel) of the memory string MS (memory transistors MTr1-MTr8) and the back gate transistor BTr.

The memory gate insulating layer 43 includes, from a side of a side surface of the memory hole 42 to a memory semiconductor layer 44 side, a block insulating layer 43a, a charge storage layer 43b, and a tunnel insulating layer 43c. The charge storage layer 43b is configured capable of storing a charge.

The block insulating layer 43a is formed with a certain thickness on a side wall of the memory hole 42. The charge storage layer 43b is formed with a certain thickness on a side wall of the block insulating layer 43a. The tunnel insulating layer 43c is formed with a certain thickness on a side wall of the charge storage layer 43b. The block insulating layer 43a and the tunnel insulating layer 43c are formed by silicon oxide ($SiO_2$) or the like, and the charge storage layer 43b is formed by silicon nitride (SiN) or the like.

The memory semiconductor layer 44 is formed filling the back gate hole 32 and the memory hole 42. The memory semiconductor layer 44 includes a pair of columnar semiconductor layers 44A extending in the perpendicular direction to the main surface of the substrate 20 and a joining semiconductor layer 44B which joins lower ends of the pair of columnar semiconductor layers 44A, and is formed in a U shape as viewed from the row direction. The memory semiconductor layer 44 is formed by, for example, polysilicon (poly-Si).

The above-described back gate layer 30 is formed surrounding a side surface of the joining semiconductor layer 44B via the memory gate insulating layer 43. Moreover, the word line conductive layers 41a-41d are formed surrounding a side surface of the columnar semiconductor layers 44A via the memory gate insulating layer 43.

As shown in FIGS. 3 and 4, the select transistor layer 50 includes a source side conductive layer 51a and a drain side conductive layer 51b. The source side conductive layer 51a functions as the source side select gate line SGS and the gate of the source side select transistor SSTr. The drain side conductive layer 51b functions as the drain side select gate line SGD and the gate of the drain side select transistor SDTr.

The source side conductive layer 51a is formed in a layer above one of the columnar semiconductor layers 44A configuring the memory semiconductor layer 44. The drain side conductive layer 51b is in the same layer as the source side conductive layer 51a and is formed in a layer above the other of the columnar semiconductor layers 44A configuring the memory semiconductor layer 44. The source side conductive layer 51a and the drain side conductive layer 51b are formed extending in the row direction and having a certain pitch in the column direction. The source side conductive layer 51a and the drain side conductive layer 51b are formed by, for example, polysilicon (poly-Si).

As shown in FIG. 4, the select transistor layer 50 includes a source side hole 52a and a drain side hole 52b. The source side hole 52a is formed penetrating the source side conductive layer 51a. The drain side hole 52b is formed penetrating the drain side conductive layer 51b. The source side hole 52a and the drain side hole 52b are each formed at a position aligning with the memory hole 42.

As shown in FIG. 4, the select transistor layer 50 includes a source side gate insulating layer 53a, a source side columnar semiconductor layer 54a, a drain side gate insulating layer 53b, and a drain side columnar semiconductor layer 54b. The source side columnar semiconductor layer 54a functions as a body (channel) of the source side select transistor SSTr. The drain side columnar semiconductor layer 54b functions as a body (channel) of the drain side select transistor SDTr.

The source side gate insulating layer 53a is formed with a certain thickness on a side surface of the source side hole 52a. The source side columnar semiconductor layer 54a is formed extending in the perpendicular direction to the main surface of the substrate 20 and in contact with a side surface of the source side gate insulating layer 53a and an upper surface of one of the pair of columnar semiconductor layers 44A. The source side columnar semiconductor layer 54a is formed by, for example, polysilicon (poly-Si).

The drain side gate insulating layer 53b is formed with a certain thickness on a side surface of the drain side hole 52b. The drain side columnar semiconductor layer 54b is formed extending in the perpendicular direction to the main surface of the substrate 20 and in contact with a side surface of the drain side gate insulating layer 53b and an upper surface of the other of the pair of columnar semiconductor layers 44A. The drain side columnar semiconductor layer 54b is formed by, for example, polysilicon (poly-Si).

The wiring layer 60 includes a source line layer 61, a bit line layer 62, and a plug layer 63. The source line layer 61 functions as the source line SL. The bit line layer 62 functions as the bit line BL.

The source line layer 61 is formed extending in the row direction and in contact with an upper surface of the source side columnar semiconductor layer 54a. The bit line layer 62 is formed extending in the column direction and in contact with an upper surface of the drain side columnar semiconductor layer 54b via the plug layer 63. The source line layer 61, the bit line layer 62, and the plug layer 63 are formed by, for example, a metal, such as tungsten.

Next, a configuration of the word line contact portion 70 located in a periphery of the memory block MB is described with reference to FIG. 4. The above-mentioned back gate conductive layer 31, word line conductive layers 41a-41d, and source side conductive layer 51a (drain side conductive layer 51b) extend from the memory block MB to the word line contact portion 70.

As shown in FIG. 4, the back gate conductive layer 31, the word line conductive layers 41a-41d, and the source side conductive layer 51a (drain side conductive layer 51b) are formed in a stepped shape such that positions of their ends in the row direction differ. That is, ends in the row direction of the back gate conductive layer 31, the word line conductive layers 41a-41d, and the source side conductive layer 51a (drain side conductive layer 51b) configure a stepped portion ST having its end formed in a stepped shape. The stepped portion ST includes steps ST(1)-ST(5) aligned in the row direction.

As shown in FIG. 4, the steps ST(1)-ST(5) are lined up from a lower layer to an upper layer. The steps ST(1)-ST(5) are formed having step widths L1-L5 in the row direction. The step widths L1-L5 become broader the higher the layer. That is, the step widths L1-L5 are set such that L1<L2<L3<L4<L5.

Moreover, contact layers 71a-71e extending from above are formed in the stepped portion ST. The contact layer 71a contacts an upper surface of the back gate conductive layer 31 (step ST(1)). In addition, the contact layers 71b-71e contact, respectively, upper surfaces of the word line conductive layers 41a-41d (steps ST(2)-ST(5)). Provided to each of upper surfaces of the contact layers 71a-71e is a leader line 72 extending in a direction parallel to the main surface of the substrate 20.

The contact layers 71a-71e are formed in a tapered shape. In the etching when forming the contact layers 71a-71e, a shallow-bottomed contact hole is fastest to reach its target conductive layer 41, hence has a hole diameter proportionately larger.

In this regard, in the present embodiment, step widths L1-L5 are set to become gradually larger with increasing height of layer from step ST(1) to step ST(5). As a result, hole diameters of the contact layers 71 and step widths L1-L5 correspond to enable amounts that the hole diameters have increased to be absorbed.

[Method of Manufacturing]

Next, a method of manufacturing a nonvolatile semiconductor memory device according to the first embodiment is described with reference to FIGS. 5-12. FIGS. 5-12 are cross-sectional views showing manufacturing processes of the nonvolatile semiconductor memory device according to the first embodiment.

Figure 5:
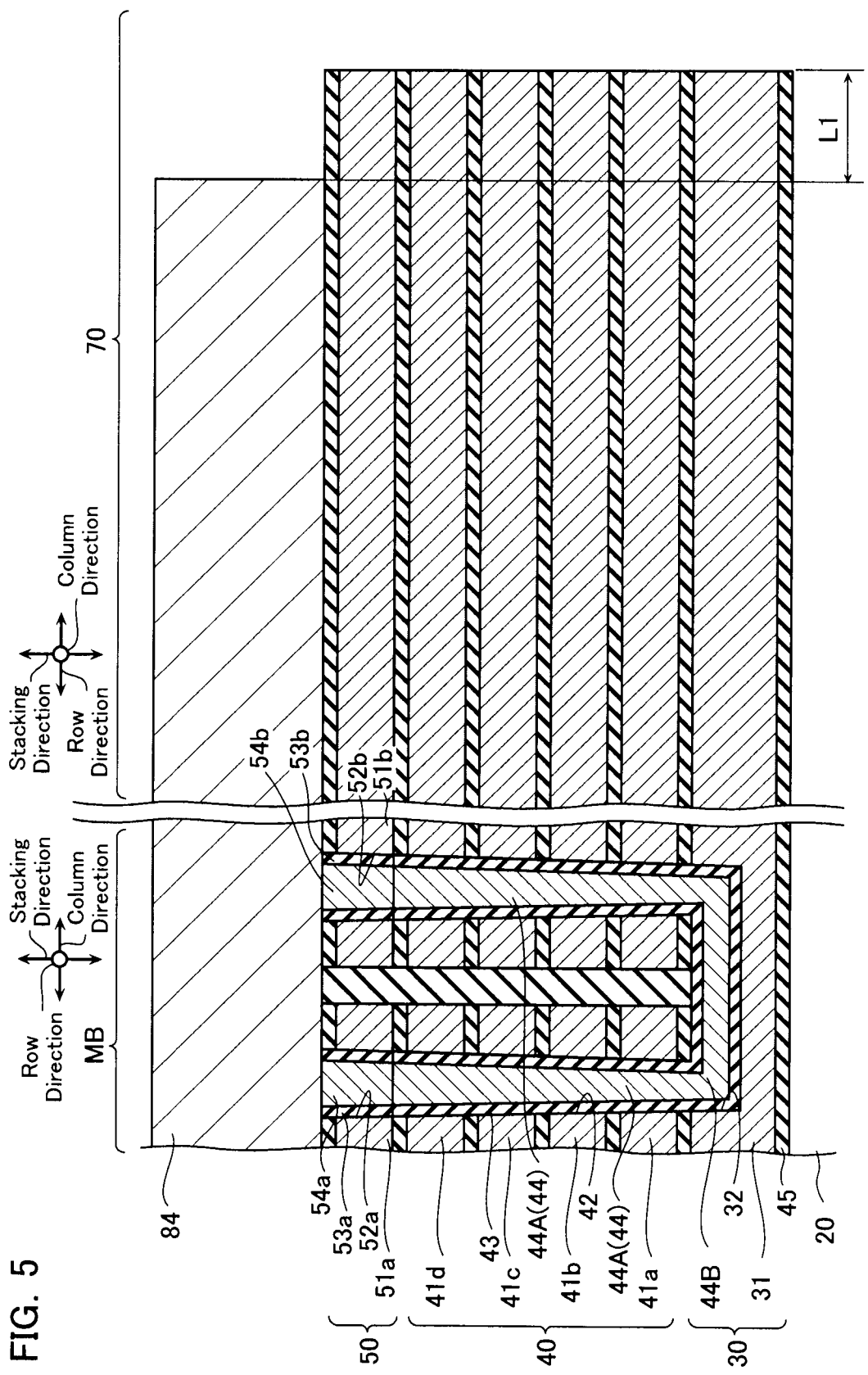
FIG. 5 is a cross-sectional view showing a manufacturing process of the nonvolatile semiconductor memory device according to the first embodiment.
Figure 6:
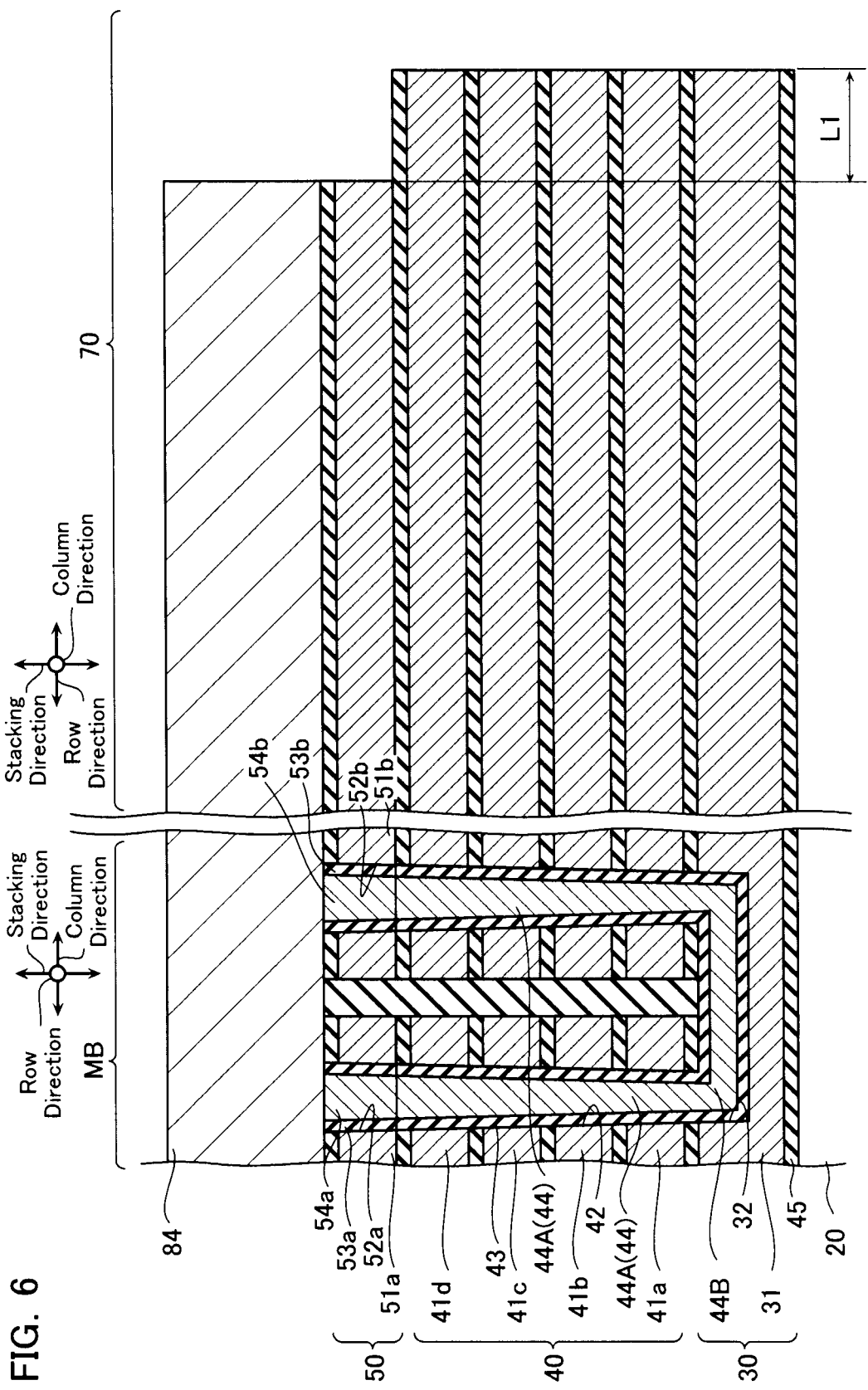
FIG. 6 is a cross-sectional view showing a manufacturing process of the nonvolatile semiconductor memory device according to the first embodiment.

First, as shown in FIG. 5, the back gate layer 30, the memory layer 40, and the select transistor layer 50 are formed on an upper surface of the substrate 20. Then, resist 84 is formed on the select transistor layer 50. The resist 84 is formed exposing an upper surface of the source side conductive layer 51a (drain side conductive layer 51b) along a region having a length L1 in the row direction from the ends of the word line conductive layers 41a-41d. Next, as shown in FIG. 6, etching is performed on the source side conductive layer 51a (drain side conductive layer 51b) via the resist 84. As a result, the source side conductive layer 51a (drain side conductive layer 51b) is removed along the region having the length L1 in the row direction from the ends of the word line conductive layers 41a-41d.

Figure 7:
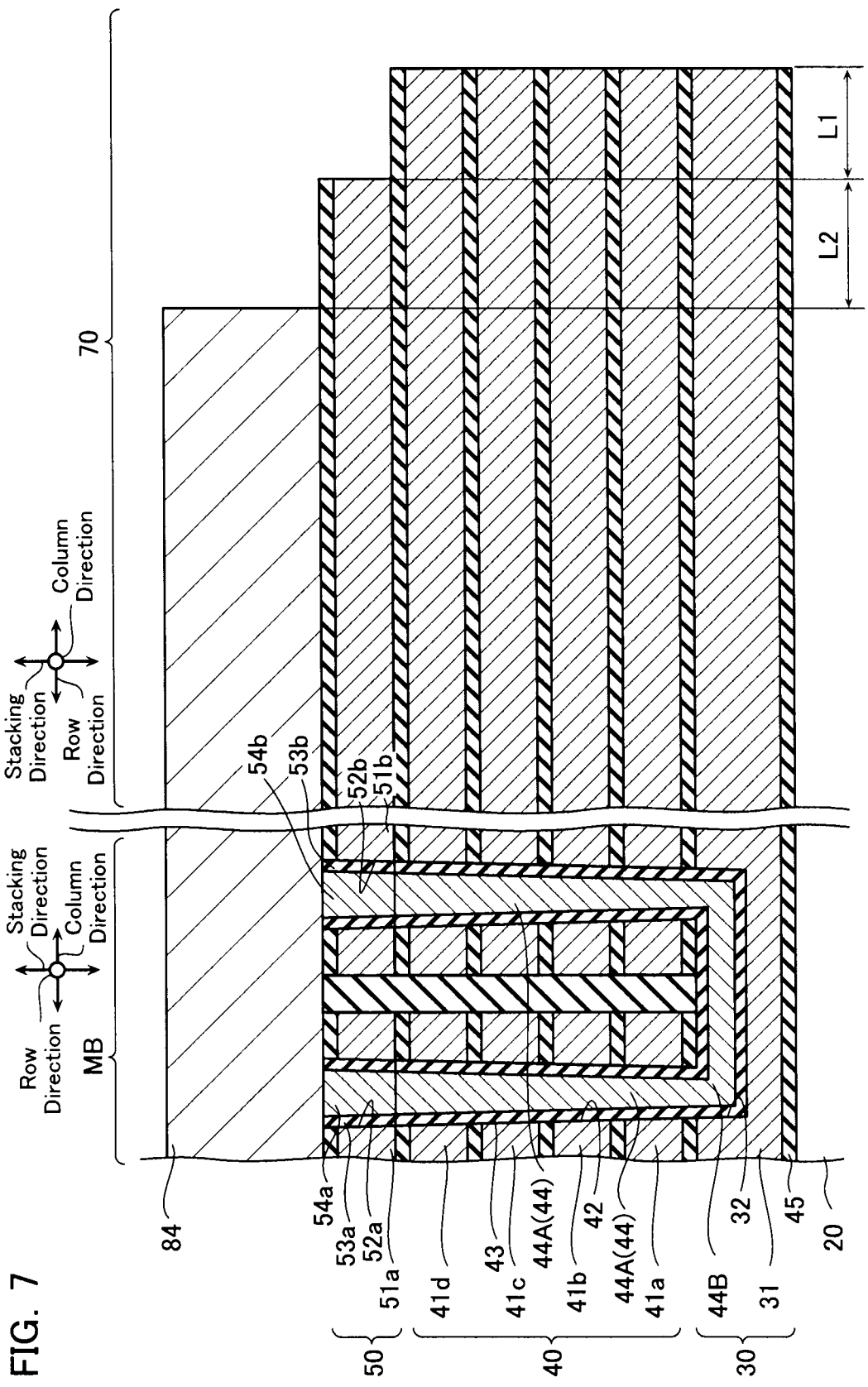
FIG. 7 is a cross-sectional view showing a manufacturing process of the nonvolatile semiconductor memory device according to the first embodiment.
Figure 8:
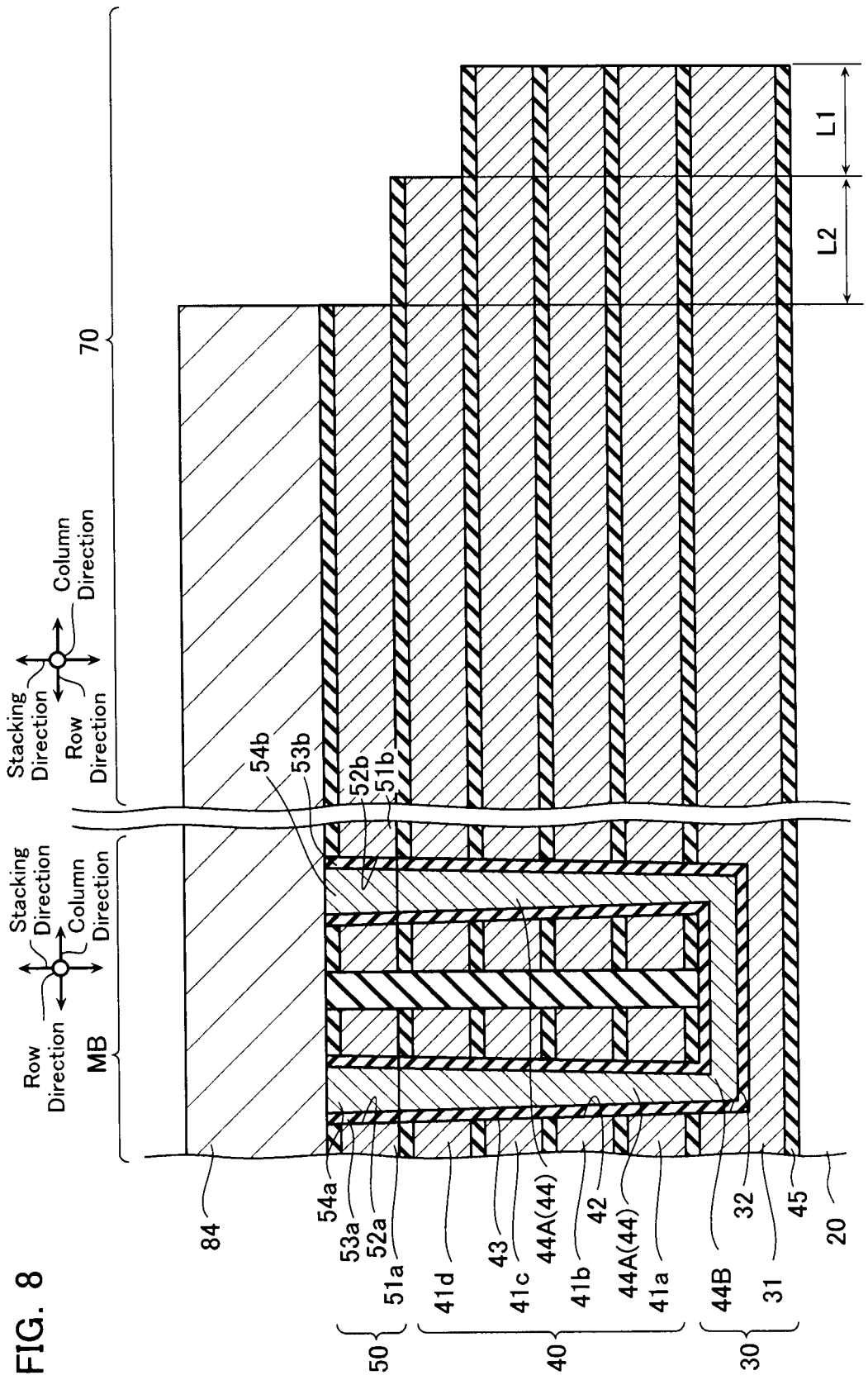
FIG. 8 is a cross-sectional view showing a manufacturing process of the nonvolatile semiconductor memory device according to the first embodiment.

Subsequently, as shown in FIG. 7, the resist 84 is cutback by an amount of a length L2 in the row direction to expose upper surfaces of the source side conductive layer 51a (drain side conductive layer 51b) and the word line conductive layer 41d along a region having a length L1+L2 in the row direction from the ends of the word line conductive layers 41a-41d. At this time, a reduction width L2 of the resist 84 is increased by 10% or more over L1. Next, as shown in FIG. 8, etching is performed on the source side conductive layer 51a (drain side conductive layer 51b) and the word line conductive layer 41d via the resist 84. As a result, the source side conductive layer 51a (drain side conductive layer 51b) is removed along the region having the length L1+L2 in the row direction from the ends of the word line conductive layers 41a-41c. Moreover, the word line conductive layer 41d is removed along the region having the length L1 in the row direction from the ends of the word line conductive layers 41a-41c.

Figure 9:
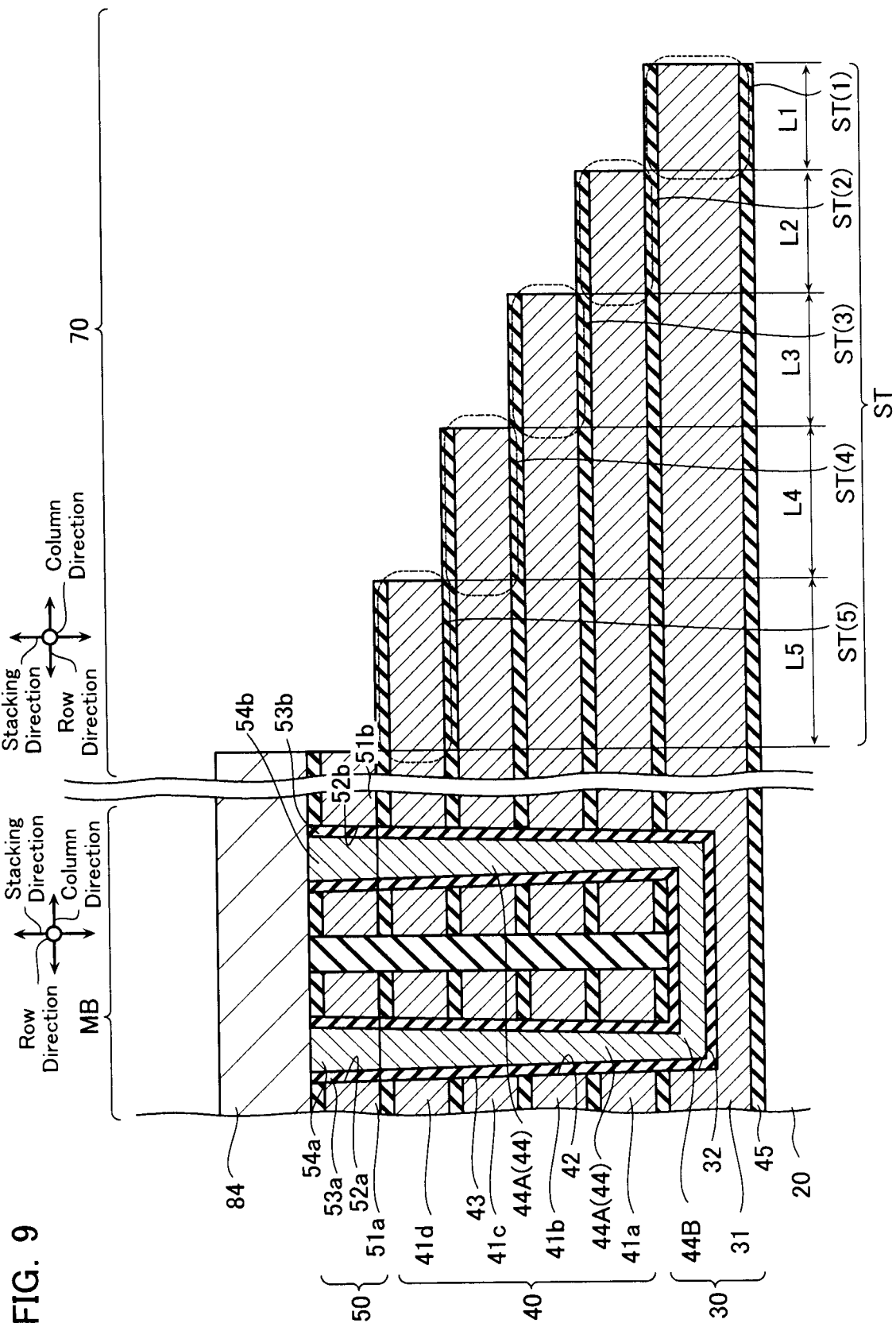
FIG. 9 is a cross-sectional view showing a manufacturing process of the nonvolatile semiconductor memory device according to the first embodiment.

Then, as shown in FIG. 9, the stepped portion ST is formed by repeating processes similar to those in above-described FIGS. 7 and 8. That is, the resist 84 is cut back by the lengths L3, L4, and L5 at a time in the row direction, and etching is performed. At this time, the reduction width L3 of the resist 84 is increased by 10% or more over L2, the reduction width L4 of the resist 84 is increased by 10% or more over L3, and the reduction width L5 of the resist 84 is increased by 10% or more over L4.

Figure 10:
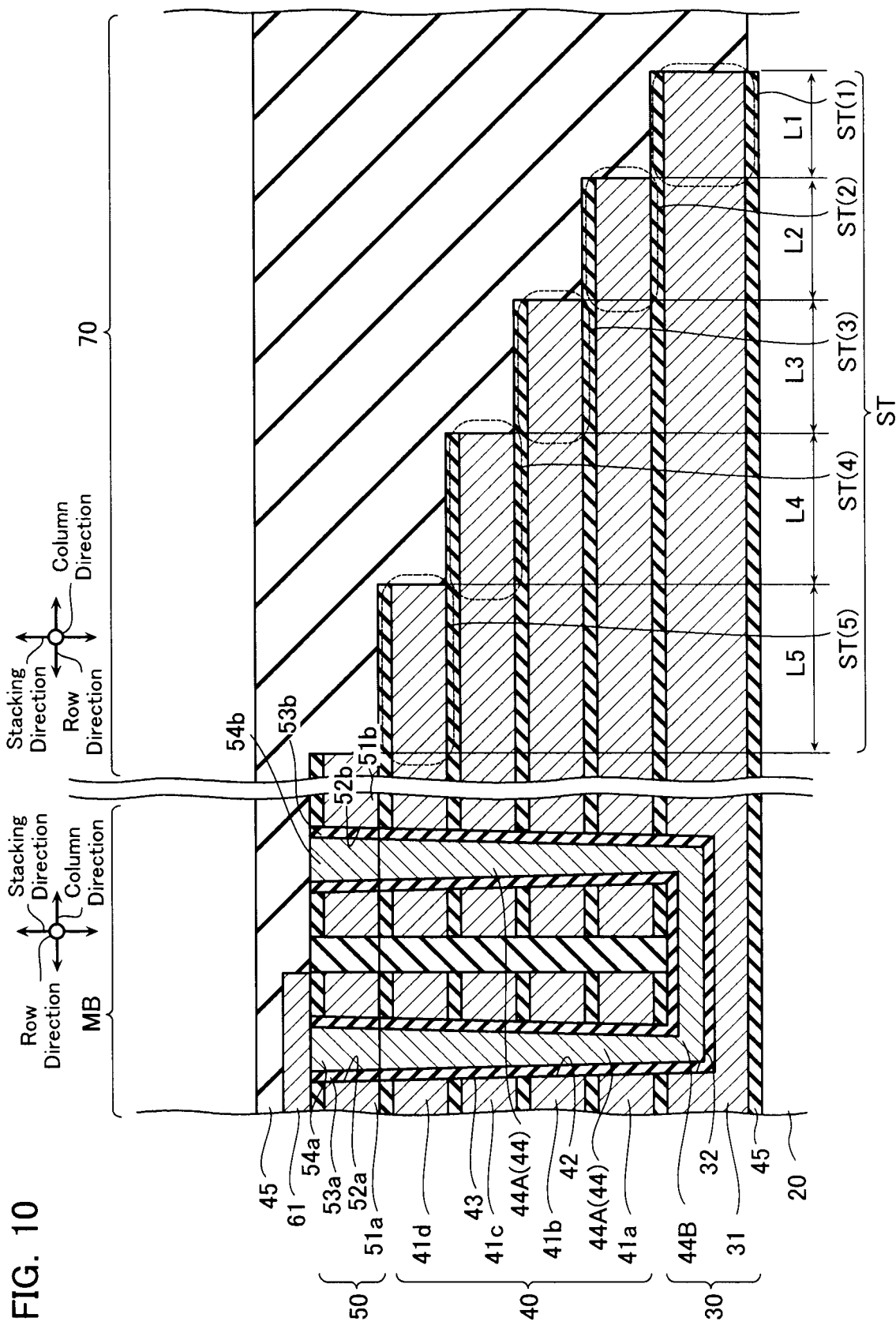
FIG. 10 is a cross-sectional view showing a manufacturing process of the nonvolatile semiconductor memory device according to the first embodiment.

Next, as shown in FIG. 10, the source line layer 61 is formed on the source side columnar semiconductor layer 54a. In addition, the interlayer insulating layer 45 is formed covering the source line layer 61, the select transistor layer 50, the memory layer 40, and the back gate layer 30.

Figure 11:
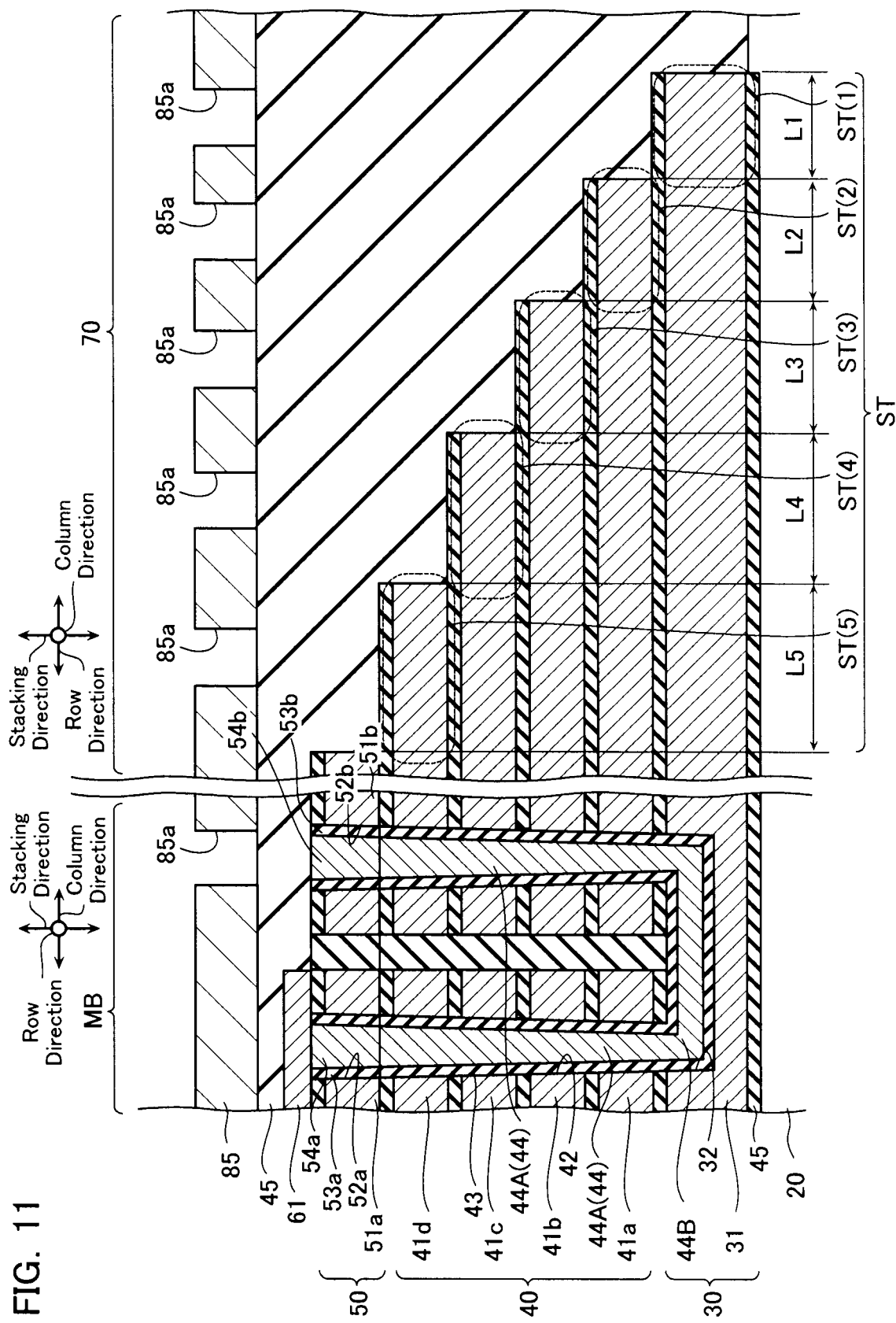
FIG. 11 is a cross-sectional view showing a manufacturing process of the nonvolatile semiconductor memory device according to the first embodiment.

Then, as shown in FIG. 11, resist 85 is formed. The resist 85 is formed to include holes 85a above the stepped portion ST and above the drain side columnar semiconductor layer 54b.

Figure 12:
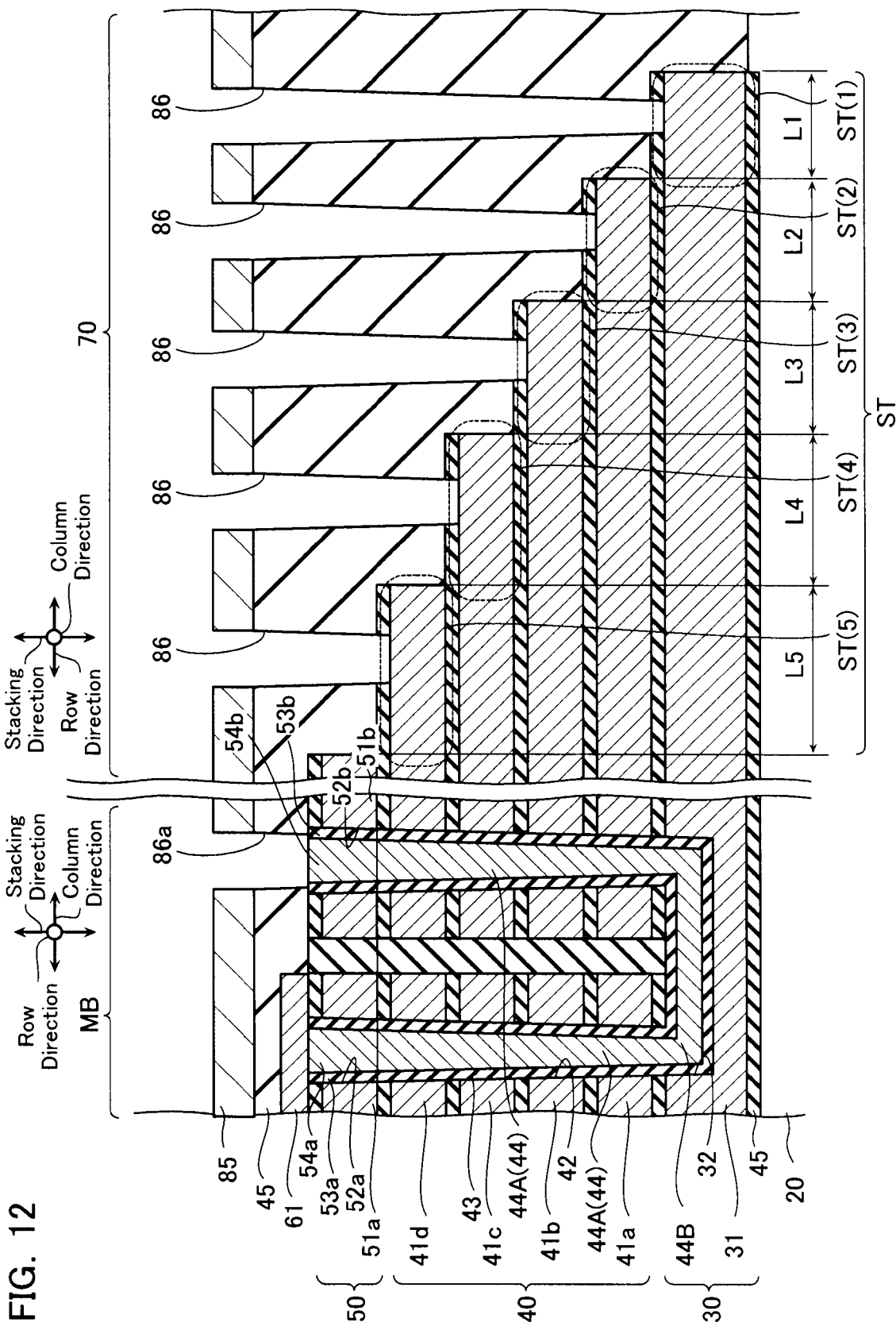
FIG. 12 is a cross-sectional view showing a manufacturing process of the nonvolatile semiconductor memory device according to the first embodiment.

Next, as shown in FIG. 12, the interlayer insulating layer 45 is etched via the resist 85. As a result, holes 86 reaching upper surfaces of the word line conductive layers 41a-41d and the back gate conductive layer 31 are formed in the stepped portion ST. In addition, a hole 86a reaching an upper surface of the drain side columnar semiconductor layer 54b is formed. Then, the contact layers 71a-71e are formed filling the holes 86, and the plug layer 63 is formed filling the hole 86a.

As indicated in the above-described manufacturing processes, of the steps ST(1) to ST(5), the step ST(5) is formed completing the greatest amount of processing and etching of the resist 84. On the other hand, of the steps ST(1) to ST(5), the step ST(1) is formed completing the least amount of processing and etching of the resist 84. Now, variation occurs in each of processing and etching of the resist 84. Hence, variation in shape of an etching target increases along with increase in number or times of processing and etching of the resist 84. Therefore, step ST(5) is considered to have greatest variation due to manufacturing processes, and step ST(1) is considered to have least variation due to manufacturing processes. Accordingly, in the first embodiment, widths L1-L5 are set to become gradually larger with increasing height of layer from step ST(1) to step ST(5). Specifically, the reduction width of the resist 84 is increased by 10% or more over the reduction width in a previous process. As a result, in the first embodiment, it is possible to secure a width enabling formation of the contact layers 71a-71e in the steps ST(1)-ST(5), even if variation in manufacturing processes causes the width of the steps ST(1)-ST(5) to be smaller than an anticipated value. Therefore, the first embodiment enables increase in wiring resistance to be suppressed.

Second Embodiment

Configuration

Figure 13:
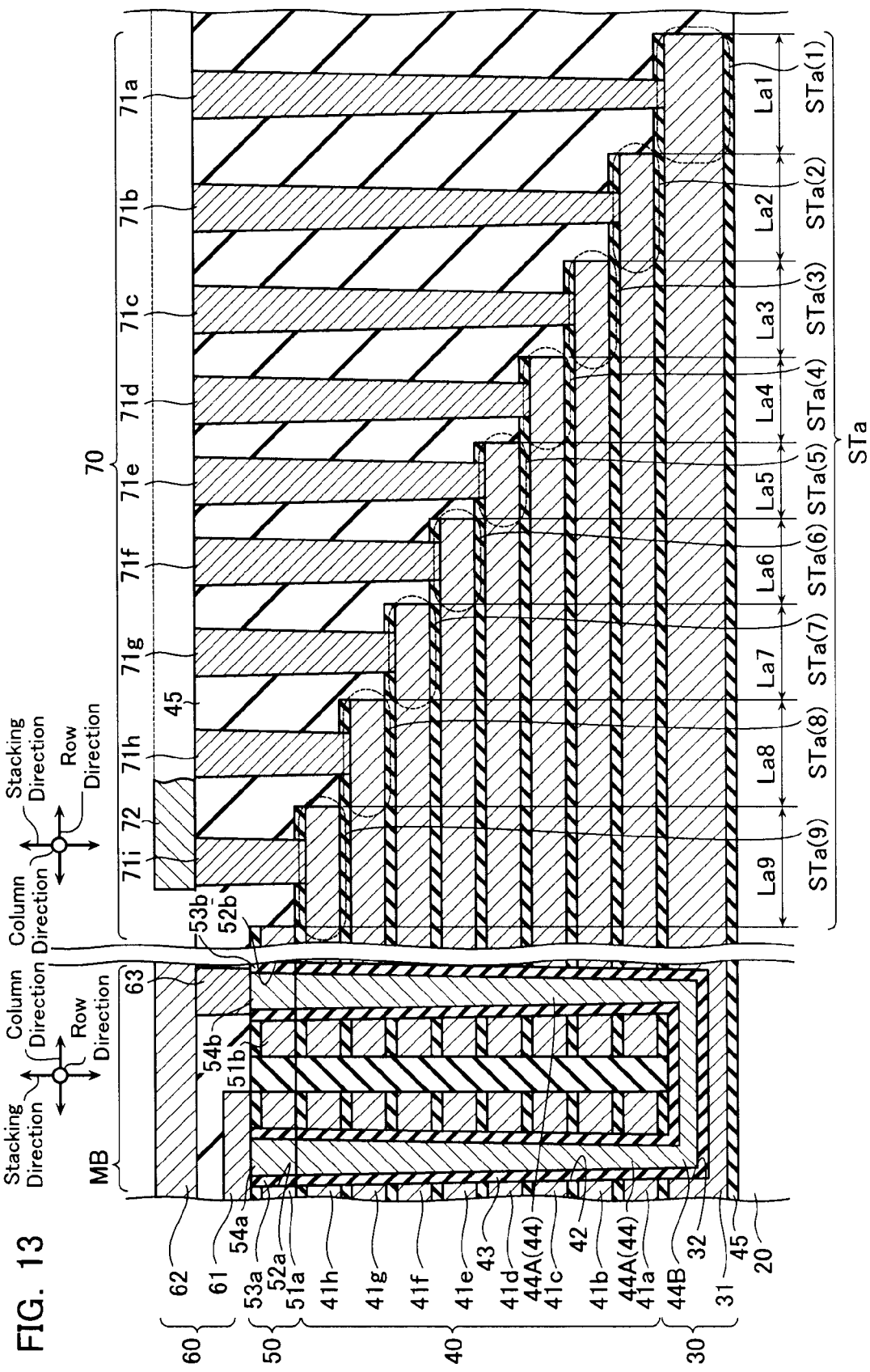
FIG. 13 is a cross-sectional view showing a memory block MB and a word line contact portion 70 according to a second embodiment.

Next, a configuration of a nonvolatile semiconductor memory device according to a second embodiment is described with reference to FIG. 13. As shown in FIG. 13, the second embodiment includes word line conductive layers 41e-41h in addition to the word line conductive layers 41a-41d, the word line conductive layers 41e-41h being in layers above the word line conductive layers 41a-41d. In this embodiment, although the word line conductive layers 41e-41h on an upper layer side have step widths that broaden the more upward the layer, conversely, the word line conductive layers 41a-41d on a lower layer side have step widths that broaden the more downward the layer. It is mainly in this regard that the second embodiment differs from the first embodiment, and other configurations are substantially similar to those in the first embodiment, with the exception of a stepped portion STa to be described later.

The word line conductive layers 41e-41h are formed surrounding the columnar semiconductor layers 44A via the memory gate insulating layer 43, similarly to the word line conductive layers 41a-41d. In the second embodiment, the source side conductive layer 51a and the drain side conductive layer 51b are formed in a layer above the word line conductive layer 41h.

As shown in FIG. 13, the back gate conductive layer 31, the word line conductive layers 41a-41h, and the source side conductive layer 51a (drain side conductive layer 51b) are formed in a stepped shape such that positions of their ends in the row direction differ. That is, ends in the row direction of the back gate conductive layer 31, the word line conductive layers 41a-41h, and the source side conductive layer 51a (drain side conductive layer 51b) configure a stepped portion STa having its end formed in a stepped shape. The stepped portion STa includes steps STa(1)-STa(9) aligned in the row direction.

Figure 20:
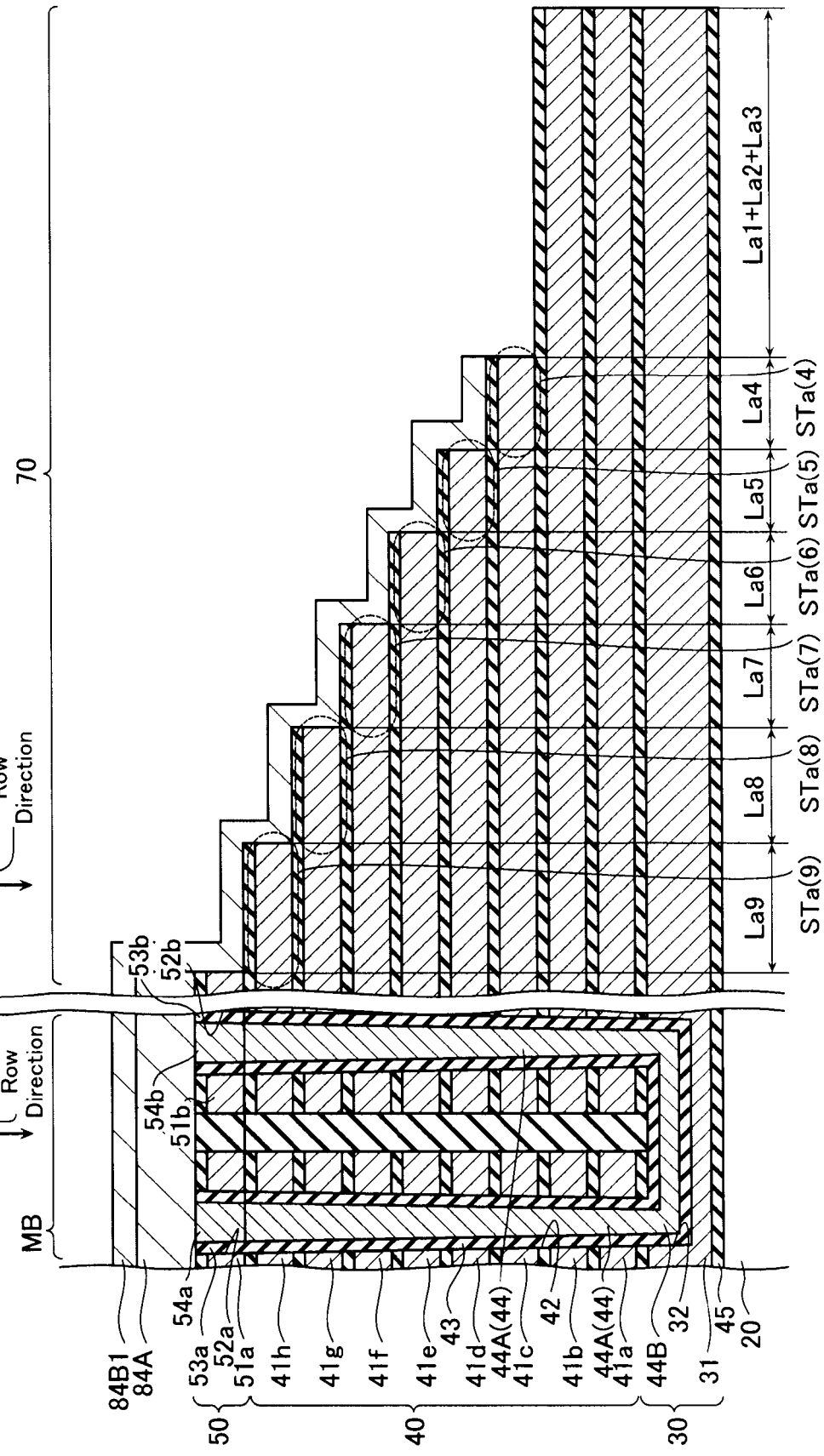
FIG. 20 is a cross-sectional view showing a manufacturing process of the nonvolatile semiconductor memory device according to the second embodiment.

As shown in FIG. 20, the steps STa(1)-STa(9) are lined up from a lower layer to an upper layer. The steps STa(1)-STa(9) are formed having widths La1-La9 in the row direction.

The step widths La1-La4 become broader the lower a layer they are in. That is, the step widths La1-La4 are set such that La1>La2>La3>La4. Moreover, the step widths La5-La9 become broader the higher a layer they are in. That is, the step widths La5-La9 are set such that La9>La8>La7>La6>La5. These widths La1-La9 are determined in view of variation in the steps STa(1)-STa(9) occurring in manufacturing processes to be described later.

Contact layers 71a-71i extending from above are formed in the stepped portion STa. The contact layers 71a-71i contact, respectively, upper surfaces of the back gate conductive layer 31 and the word line conductive layers 41a-41h in the stepped portion STa.

[Method of Manufacturing]

Next, a method of manufacturing a nonvolatile semiconductor memory device according to the second embodiment is described with reference to FIGS. 14-24. FIGS. 14-24 are cross-sectional views showing manufacturing processes of the nonvolatile semiconductor memory device according to the second embodiment.

Figure 14:
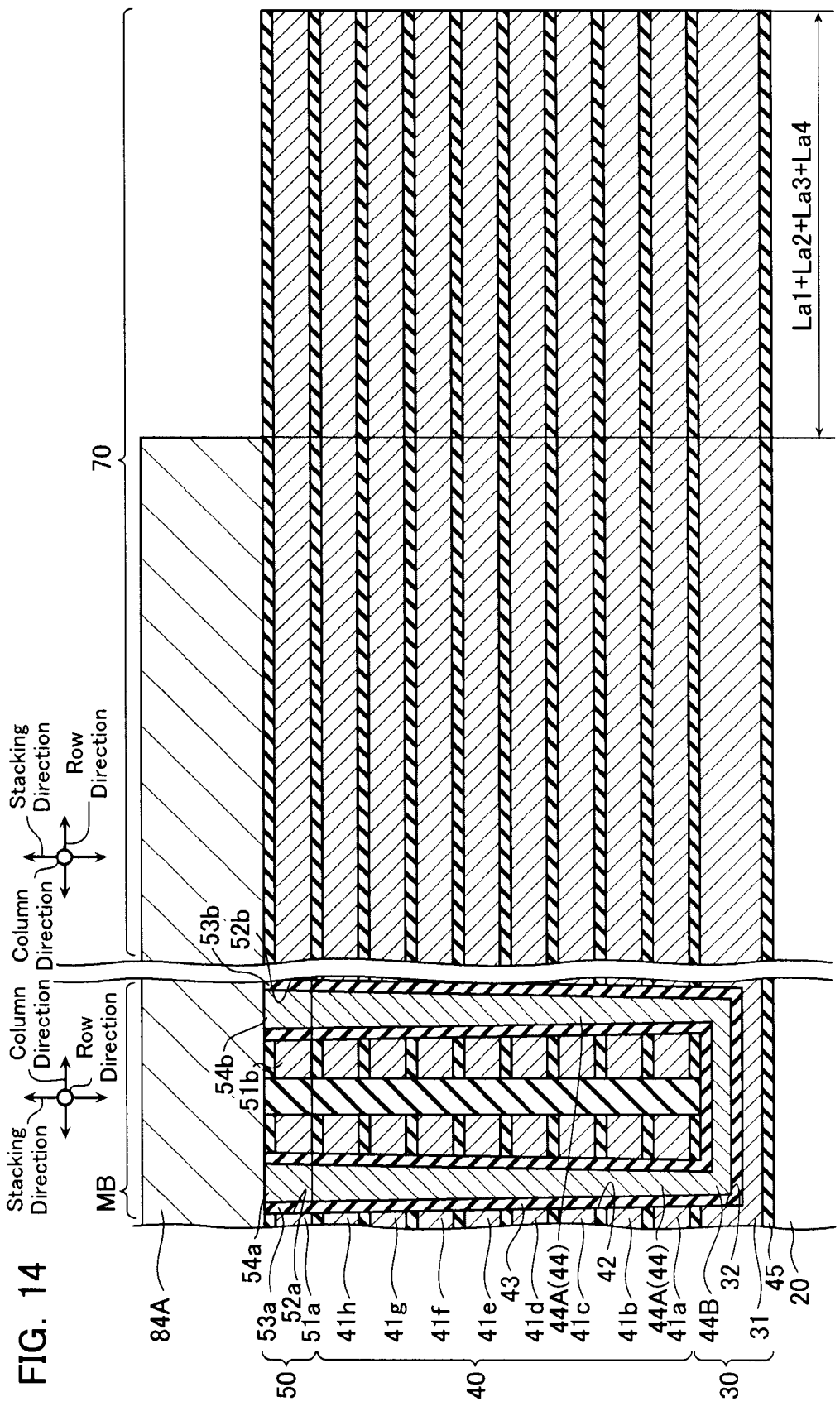
FIG. 14 is a cross-sectional view showing a manufacturing process of a nonvolatile semiconductor memory device according to the second embodiment.
Figure 15:
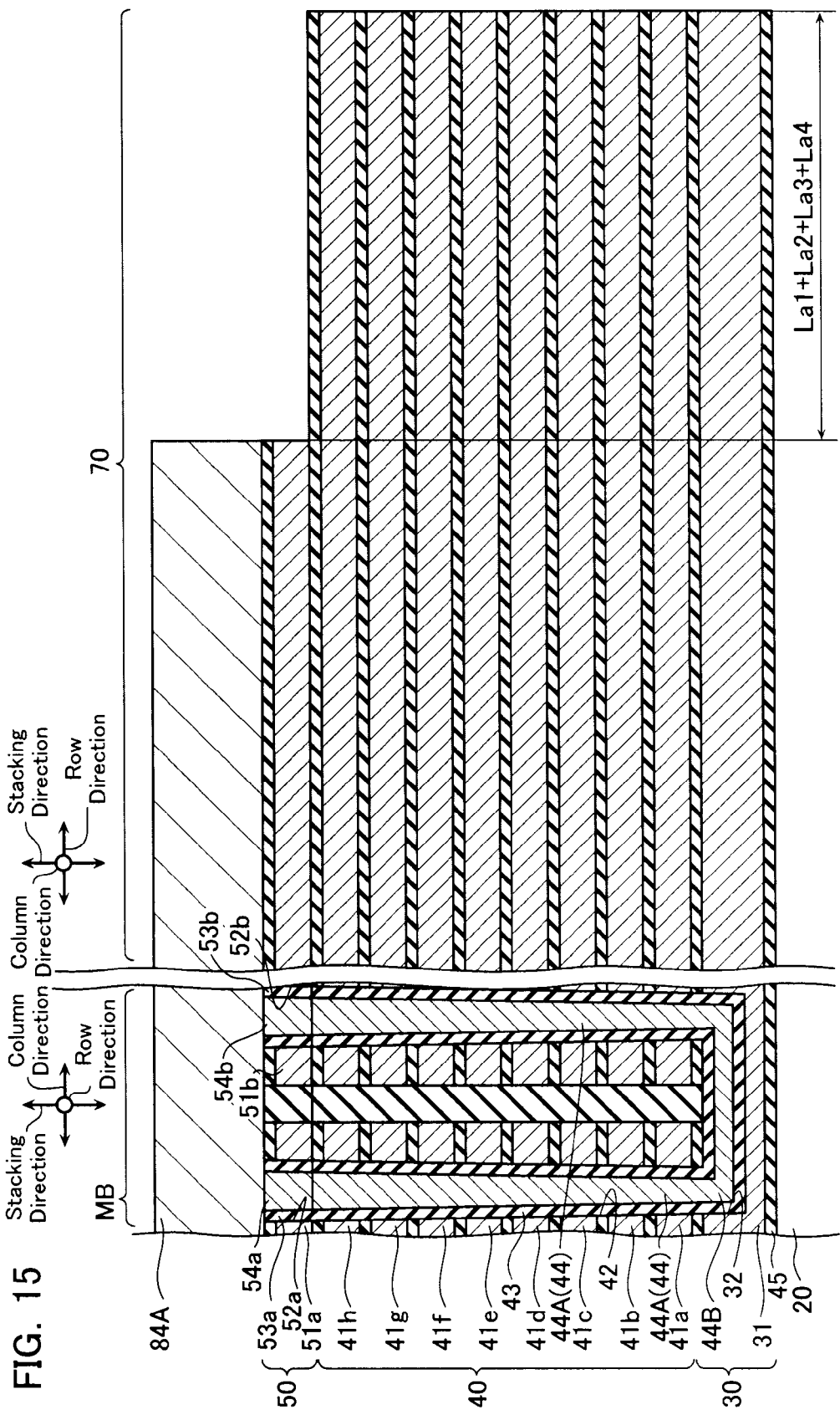
FIG. 15 is a cross-sectional view showing a manufacturing process of the nonvolatile semiconductor memory device according to the second embodiment.

First, as shown in FIG. 14, similar processes to those in the first embodiment are executed to form the memory layer 40 including the word line conductive layers 41a-41h, and the select transistor layer 50. Then, resist 84A is deposited on the select transistor layer 50. The resist 84A is formed exposing an upper surface of the source side conductive layer 51a (drain side conductive layer 51b) along a region having a length La1+La2+La3+La4 in the row direction from the ends of the word line conductive layers 41a-41h. Next, as shown in FIG. 15, etching is performed on the source side conductive layer 51a (drain side conductive layer 51b) via the resist 84A. As a result, the source side conductive layer 51a (drain side conductive layer 51b) is etched along the region having the length La1+La2+La3+La4 in the row direction from the ends of the word line conductive layers 41a-41h.

Figure 16:
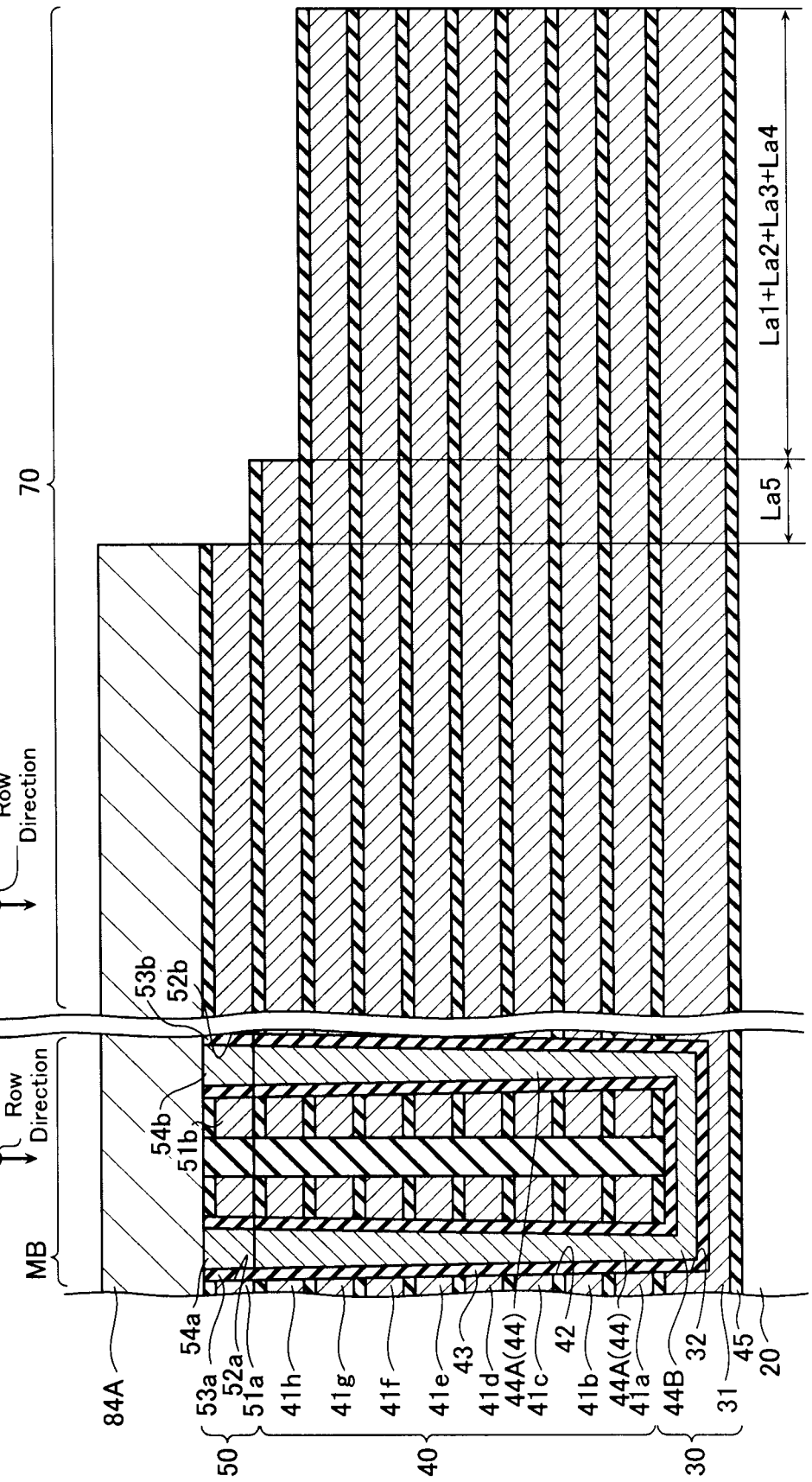
FIG. 16 is a cross-sectional view showing a manufacturing process of the nonvolatile semiconductor memory device according to the second embodiment.
Figure 17:
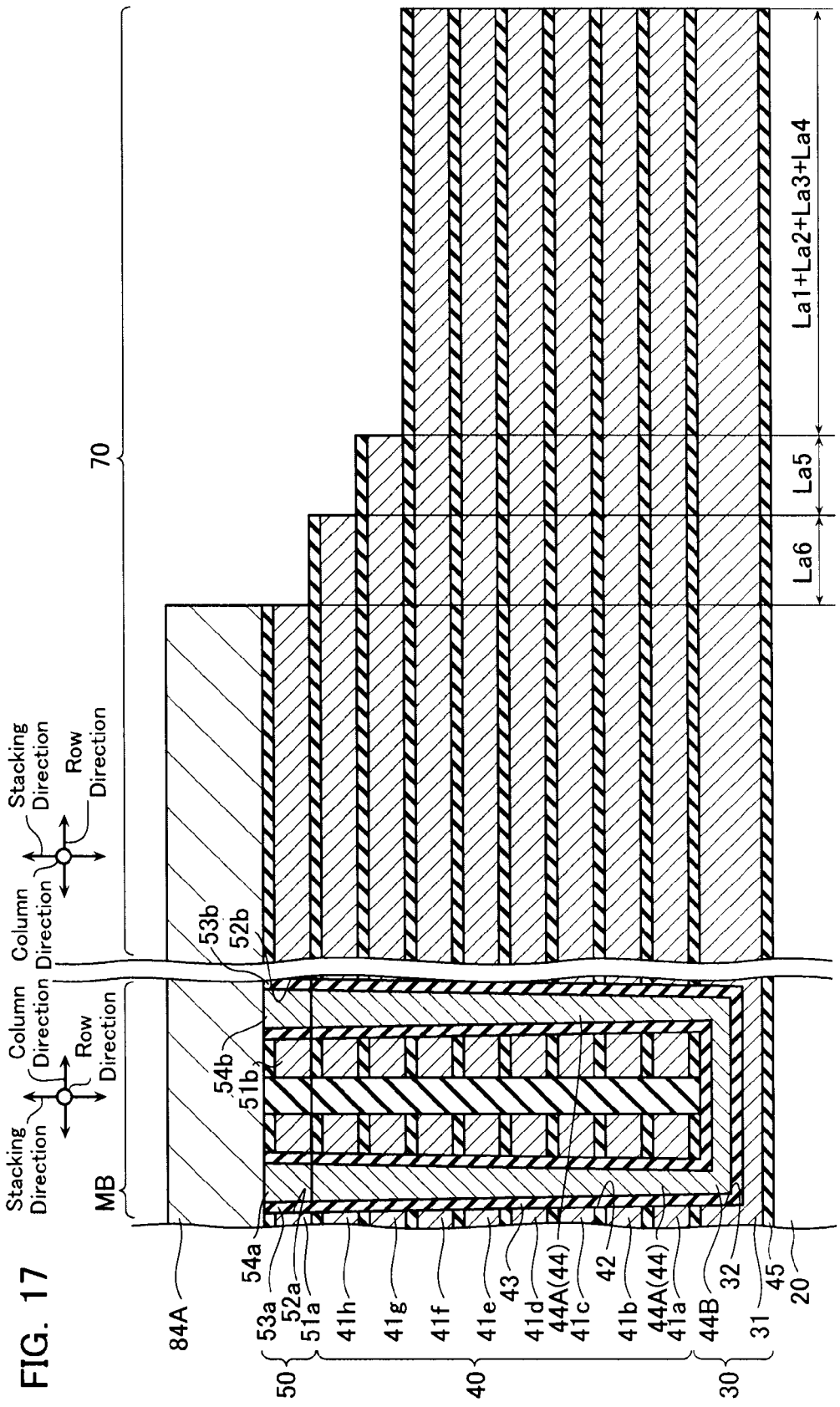
FIG. 17 is a cross-sectional view showing a manufacturing process of the nonvolatile semiconductor memory device according to the second embodiment.
Figure 18:
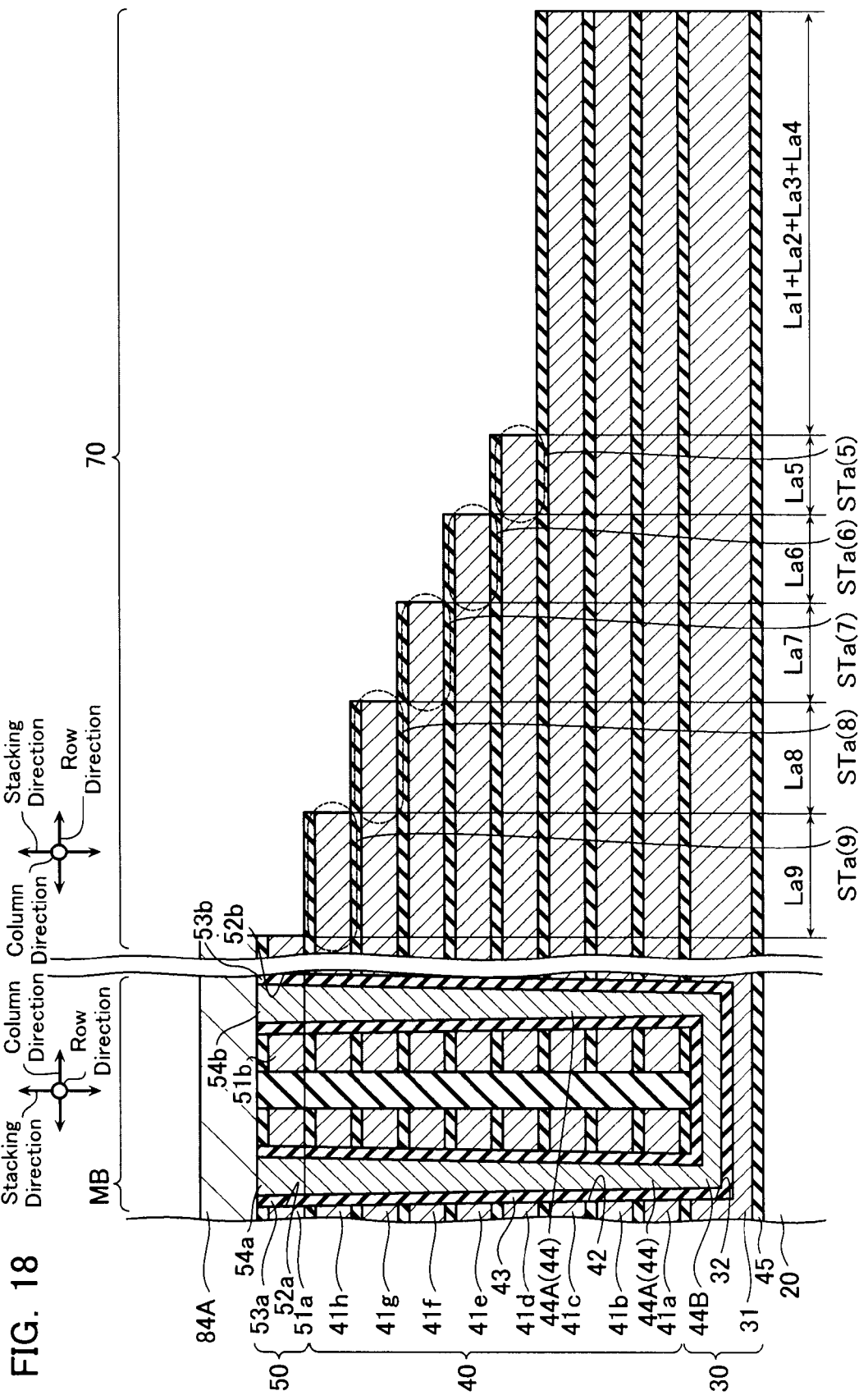
FIG. 18 is a cross-sectional view showing a manufacturing process of the nonvolatile semiconductor memory device according to the second embodiment.

Then, as shown in FIGS. 16-18, the resist 84A is cut back by the lengths La5, La6, La7, La8, and La9 at a time in the row direction, and etching is performed on the source side conductive layer 51a (drain side conductive layer 51b) and the word line conductive layers 41d-41h, similarly to in the first embodiment. This results in the steps STa(5)-STa(9) of the stepped portion STa being formed. At this time, in order to absorb cumulative structural variation, the length La6 is increased by 10% or more over the length La5, the length La7 is increased by 10% or more over the length La6, the length La8 is increased by 10% or more over the length La7, and the length La9 is increased by 10% or more over the length La8.

Figure 19:
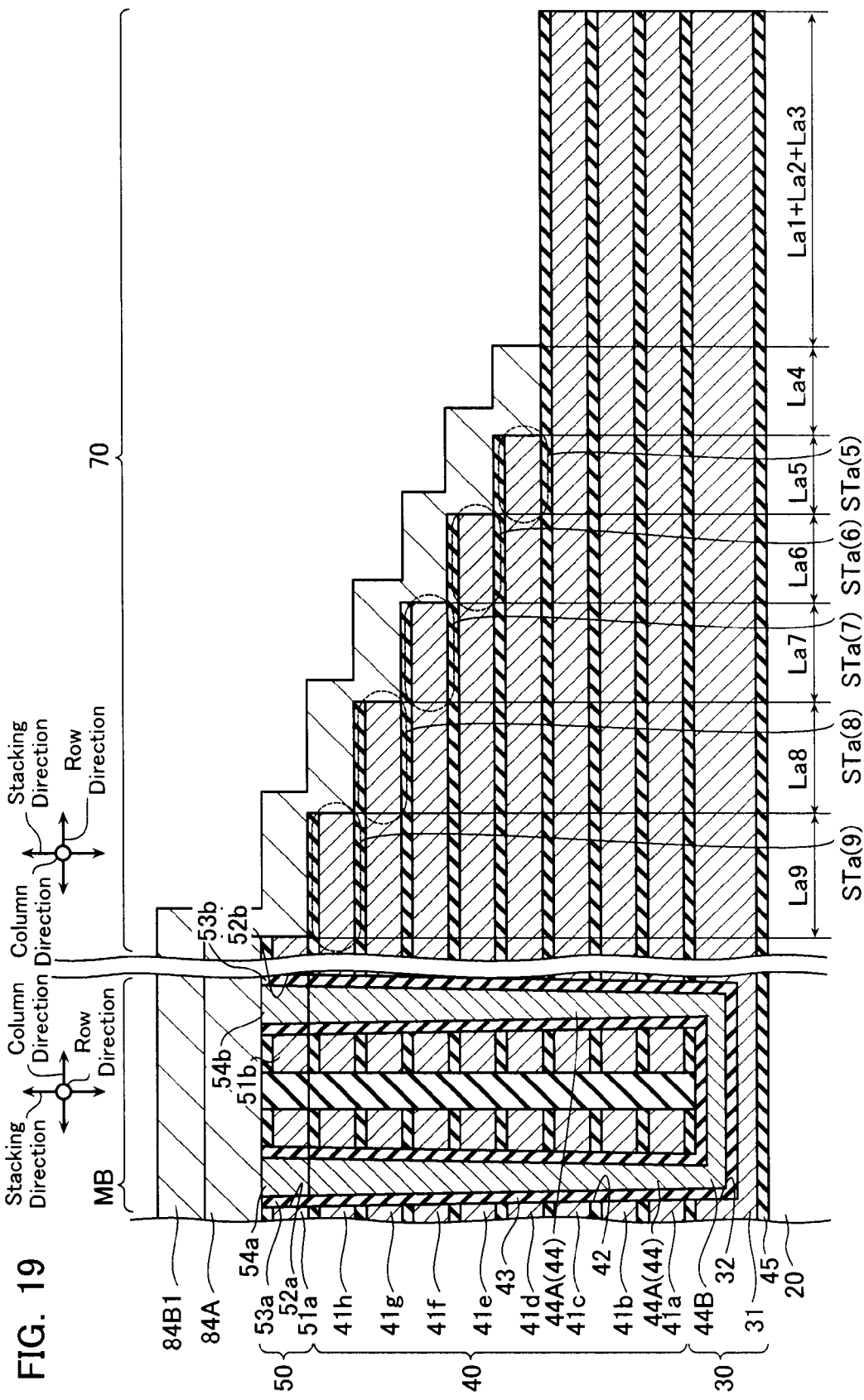
FIG. 19 is a cross-sectional view showing a manufacturing process of the nonvolatile semiconductor memory device according to the second embodiment.

Next, as shown in FIG. 19, resist 84B1 is deposited above the resist 84A, the source side conductive layer 51a (drain side conductive layer 51b), and the word line conductive layers 41c-41h to cover an end in the row direction of the resist 84A. The resist 84B1 is formed projecting in the row direction by an amount of length La4 from the end in the row direction of the resist 84A. That is, the resist 84B1 is formed exposing an upper surface of the word line conductive layer 41c along a region having a length La1+La2+La3 in the row direction from the ends of the word line conductive layers 41a-41c. Next, as shown in FIG. 20, etching is performed on the word line conductive layer 41c via the resist 84B1. As a result, the word line conductive layer 41c is removed along the region having the length La1+La2+La3 in the row direction from the ends of the word line conductive layers 41a and 41b.

Figure 21:
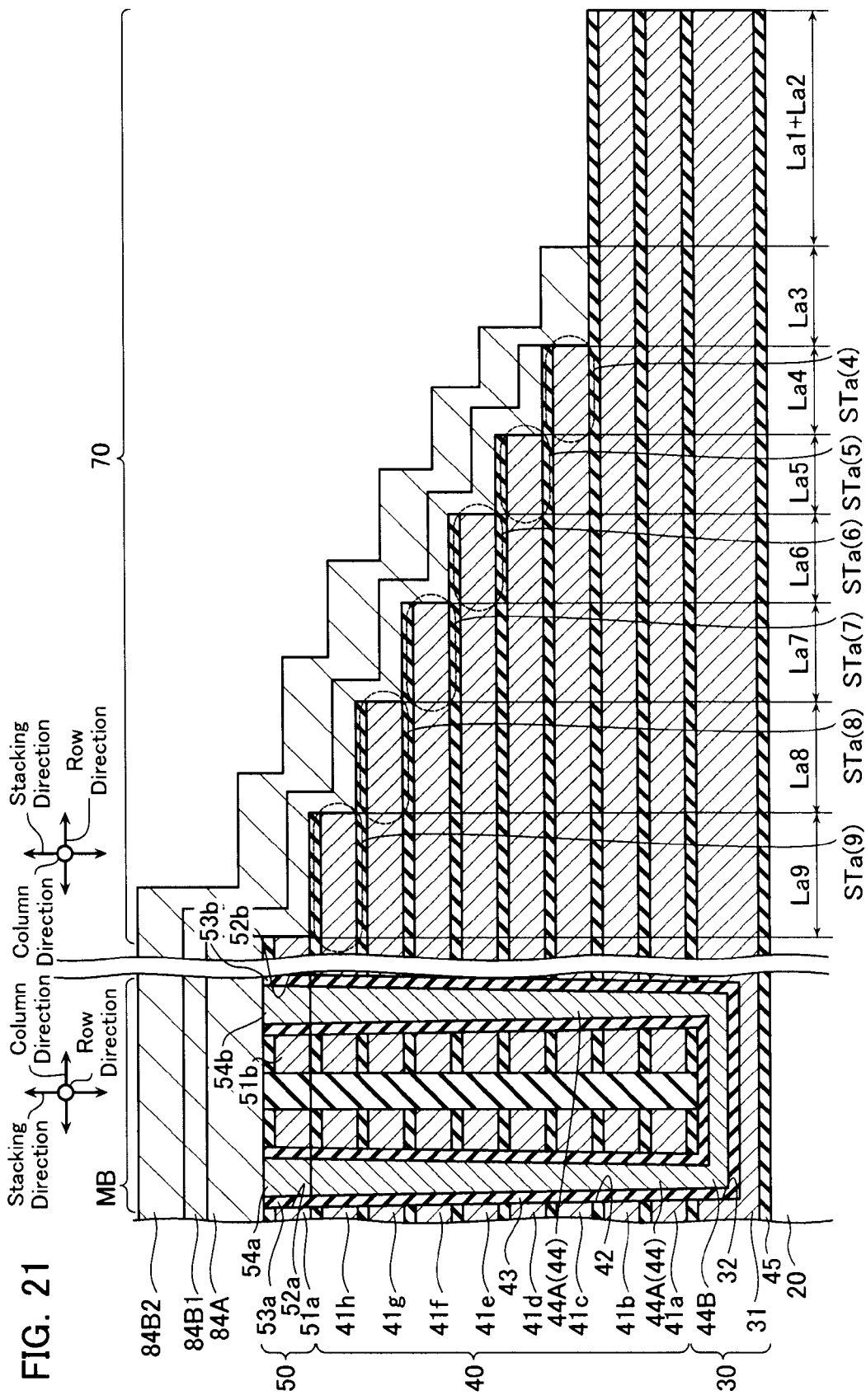
FIG. 21 is a cross-sectional view showing a manufacturing process of the nonvolatile semiconductor memory device according to the second embodiment.
Figure 22:
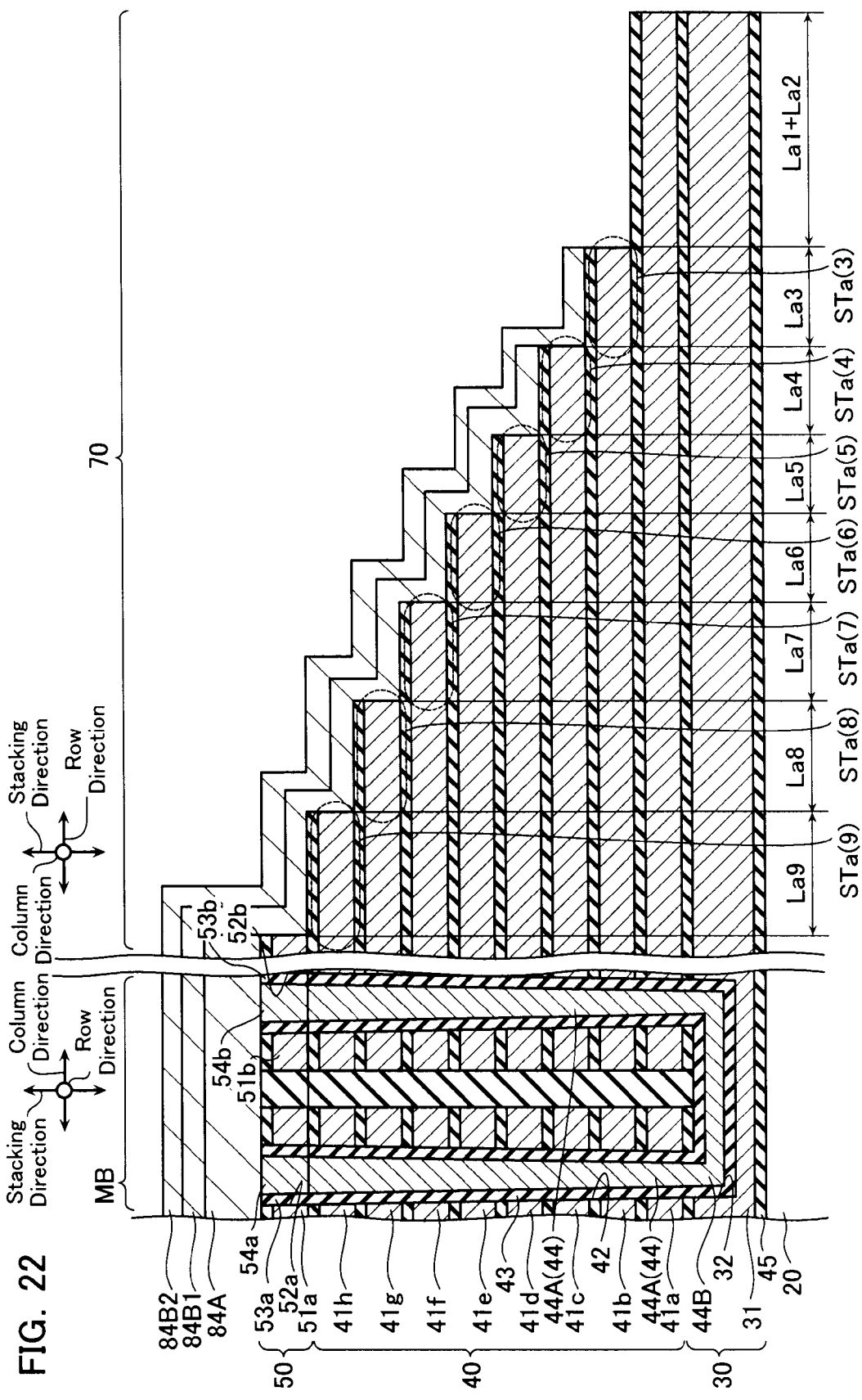
FIG. 22 is a cross-sectional view showing a manufacturing process of the nonvolatile semiconductor memory device according to the second embodiment.

Subsequently, as shown in FIG. 21, resist 84B2 is deposited above the resists 84A and 84B1, the source side conductive layer 51a (drain side conductive layer 51b), and the word line conductive layers 41b-41h to cover an end in the row direction of the resist 84B1. The resist 84B2 is formed projecting in the row direction by an amount of length La3 from the end in the row direction of the resist 84B1. That is, the resist 84B2 is formed exposing an upper surface of the word line conductive layer 41b along a region having a length La1+La2 in the row direction from the ends of the word line conductive layers 41a and 41b. Next, as shown in FIG. 22, etching is performed on the word line conductive layer 41b via the resist 84B2. As a result, the word line conductive layer 41b is removed along the region having the length La1+La2 in the row direction from the end of the word line conductive layer 41a.

Figure 23:
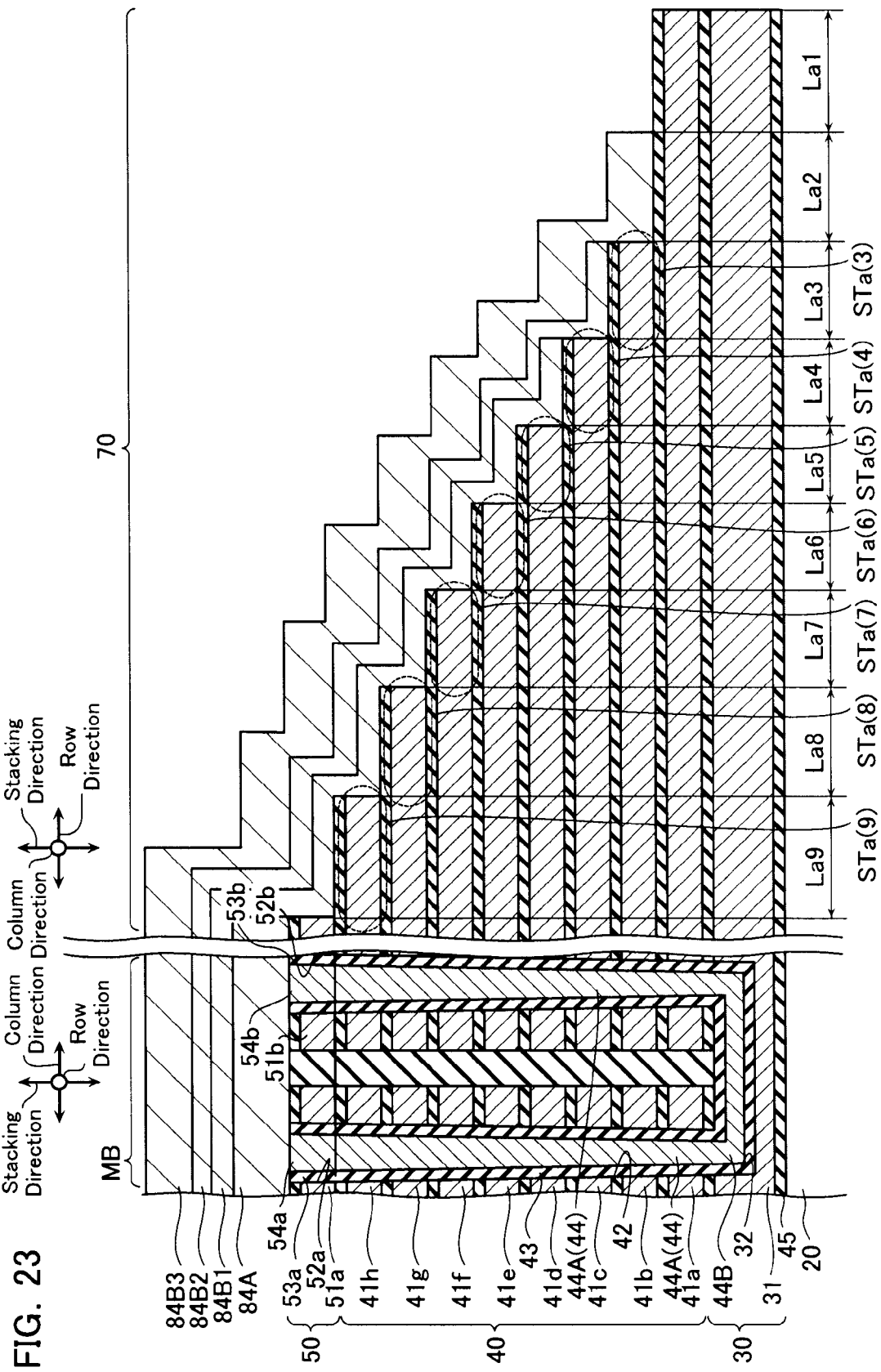
FIG. 23 is a cross-sectional view showing a manufacturing process of the nonvolatile semiconductor memory device according to the second embodiment.
Figure 24:
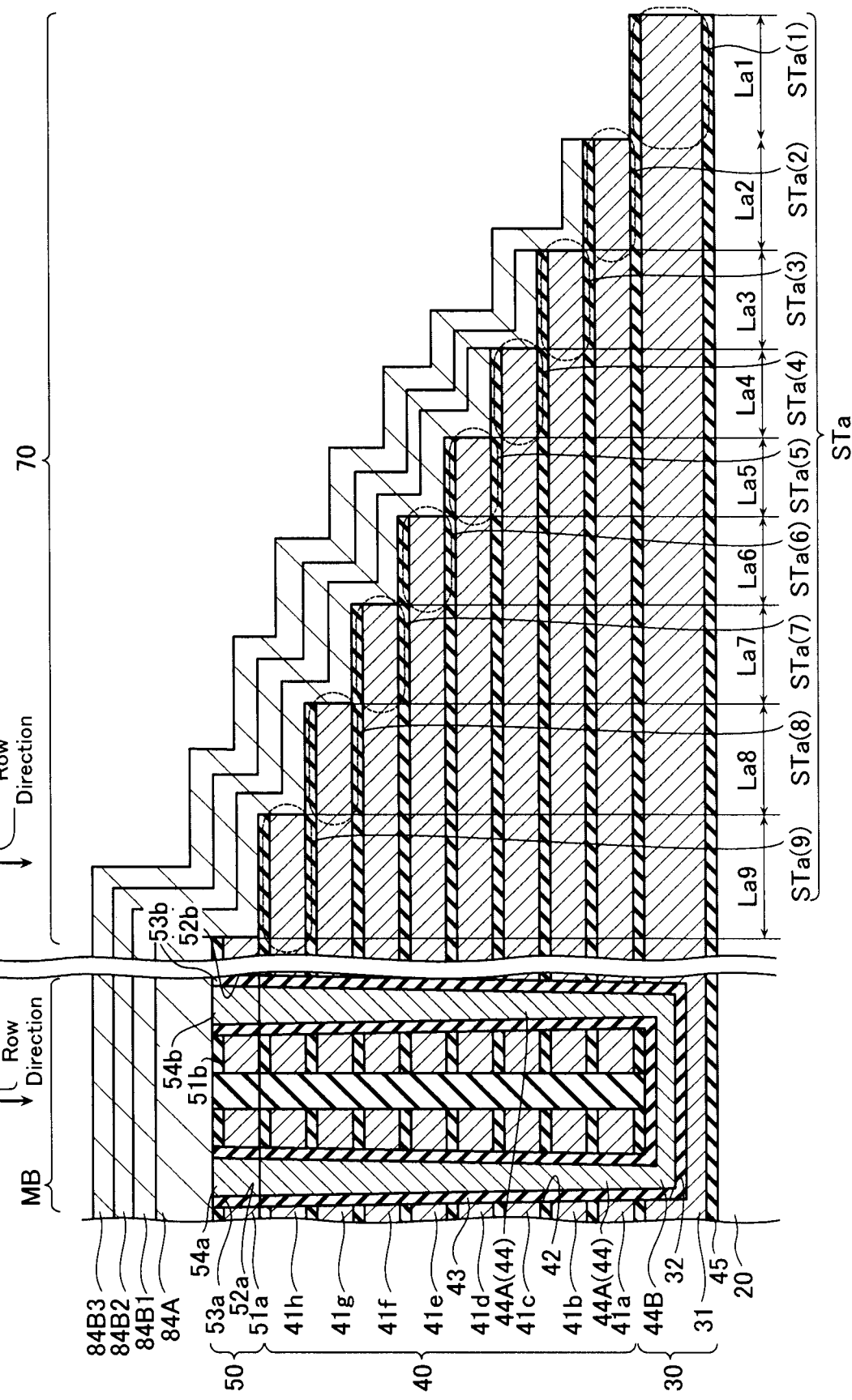
FIG. 24 is a cross-sectional view showing a manufacturing process of the nonvolatile semiconductor memory device according to the second embodiment.

Next, as shown in FIG. 23, resist 84B3 is deposited above the resists 84A, 84B1 and 84B2, the source side conductive layer 51a (drain side conductive layer 51b), and the word line conductive layers 41a-41h to cover an end in the row direction of the resist 84B2. The resist 84B3 is formed projecting in the row direction by an amount of length La2 from the end in the row direction of the resist 84B2. That is, the resist 84B3 is formed exposing an upper surface of the word line conductive layer 41a along a region having a length La1 in the row direction from the end of the back gate conductive layer 31. Next, as shown in FIG. 24, etching is performed on the word line conductive layer 41a via the resist 84B3. The above results in the steps STa(1)-STa(4) of the stepped portion STa being formed. At this time, in order to absorb cumulative structural variation, the length La4 is increased by 10% or more over the length La5, the length La3 is increased by 10% or more over the length La4, the length La2 is increased by 10% or more over the length La3, and the length La1 is increased by 10% or more over the length La2.

Next, advantages of this embodiment are described.

As etching proceeds when forming the stepped portion ST, thickness of the resist 84A is gradually reduced. Therefore, as the number of stacked layers of the word line conductive layers 41a-41h increases, there is a possibility of the resist 84A disappearing before all of the steps in the stepped portion ST are formed. In this regard, as shown in FIG. 18, when the thickness of the resist 84A approaches a limit thickness, the present embodiment switches from a so-called slimming system to a deposit system making additional applications of the resists 84B1-84B3, whereby disappearance of the resist can be suppressed.

Moreover, in the slimming system, variation in dimensions increases the higher the layer, hence step width is broadened the higher the layer, and in the deposit system, variation in dimensions increases the lower the layer, hence step width is broadened the lower the layer. As a result, the second embodiment makes it possible to secure a width allowing formation of the contact layers 71a-71i in the steps STa(1)-STa(9). Therefore, the second embodiment enables increase in wiring resistance to be suppressed.

Third Embodiment

Configuration

Next, a configuration of a nonvolatile semiconductor memory device according to a third embodiment is described with reference to FIGS. 25 and 26. The third embodiment includes a memory block MB similar to that in the first embodiment, hence a description thereof is omitted.

Figure 25:
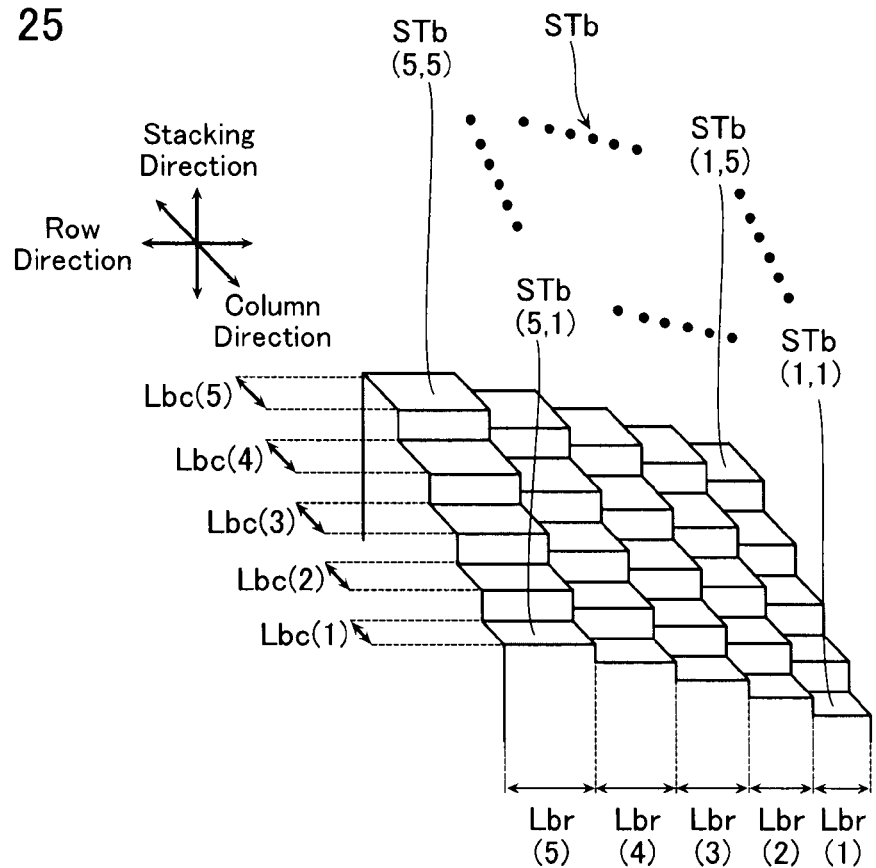
FIG. 25 is a perspective view showing a stepped portion STb in a nonvolatile semiconductor memory device according to a third embodiment.
Figure 26:
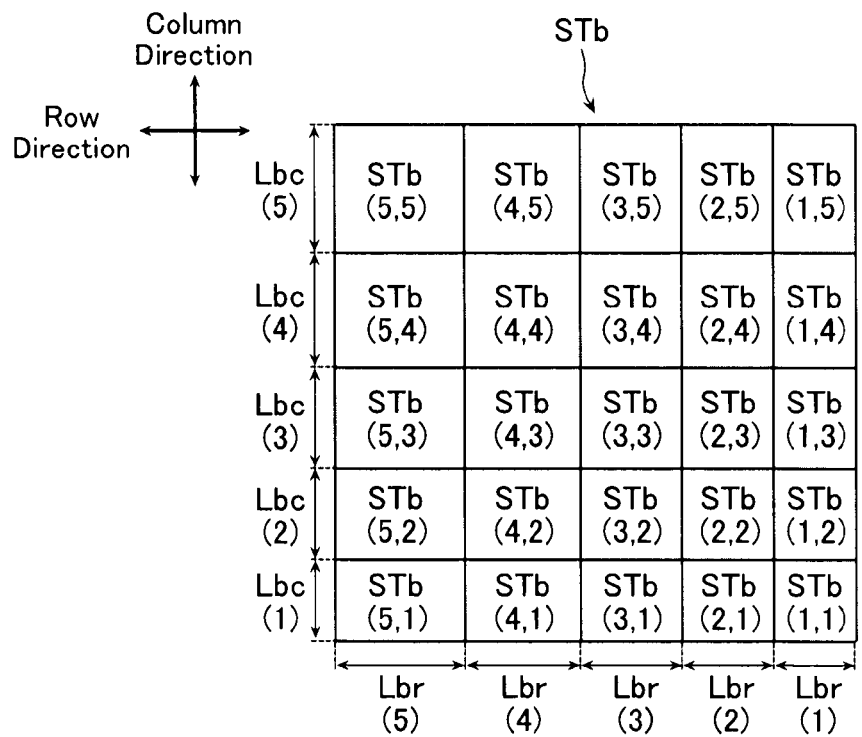
FIG. 26 is a top view showing the stepped portion STb in the nonvolatile semiconductor memory device according to the third embodiment.

As shown in FIGS. 25 and 26, the third embodiment includes a stepped portion STb having steps STb(1,1)-STb(5,5) disposed in a matrix in the row direction and the column direction. The steps STb(1,1)-STb(5,5) are configured by the back gate conductive layer 31 and the word line conductive layers 41a-41d.

As shown in FIGS. 25 and 26, the steps STb(1,1)-STb(5,5) are disposed, for example, from a lowermost layer to an uppermost layer, in a sequence STb(1,1), STb(1,2), STb(1,5), STb(2,1), . . . , STb(4,5), STb(5,1), . . . , STb(5,5). Hence, each step STb(i,j) is located in a different layer.

Moreover, the steps STb(1,1)-STb(5,5) have their width in the row direction and width in the column direction both becoming broader the higher the layer. More specifically, row-direction widths Lbr(n) of the steps STb(1,n)-STb(5,n) are configured such that Lbr(1)<Lbr(2)<Lbr(3)<Lbr(4)<Lbr(5), and column-direction widths Lbc(n) of the steps STb(n,1)-STb(n,5) are configured such that Lbc(1)<Lbc(2)<Lbc(3)<Lbc(4)<Lbc(5).

[Method of Manufacturing]

Figures 27, 28:
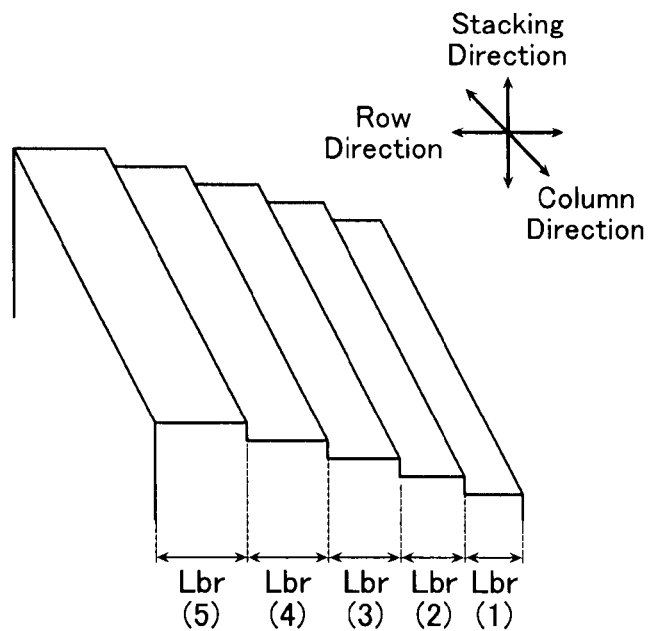
FIG. 27 is a perspective view showing a manufacturing process of the stepped portion STb in the nonvolatile semiconductor memory device according to the third embodiment.
FIG. 28 is a top view showing a stepped portion STc in a nonvolatile semiconductor memory device according to a fourth embodiment.

Next, a method of manufacturing a nonvolatile semiconductor memory device according to the third embodiment is described with reference to FIG. 27. FIG. 27 is a perspective view showing a manufacturing process of the nonvolatile semiconductor memory device according to the third embodiment. Note that in the third embodiment, only a process for forming the stepped portion STb is described.

First, as shown in FIG. 27, similar processes to those in the first embodiment are employed to process the back gate conductive layer 31, the word line conductive layers 41a-41d, and the source side conductive layer 51a (drain side conductive layer 51b) into a stepped shape in the row direction. Then, similar processes to those in the first embodiment are employed to process the back gate conductive layer 31, the word line conductive layers 41a-41d, and the source side conductive layer 51a (drain side conductive layer 51b) into a stepped shape in the column direction. As a result, the stepped portion STb shown in FIGS. 25 and 26 is formed.

As a result of forming the stepped portion STb in the above-described manner, it is possible in the third embodiment to secure a width enabling formation of the contact layers in the steps STb(1,1)-STb(5,5), even if variation in manufacturing processes causes the width of the steps STb(1,1)-STb(5,5) to be smaller than an anticipated value, similarly to in the first embodiment. Therefore, the third embodiment enables increase in wiring resistance to be suppressed.

Fourth Embodiment

Configuration

Next, a configuration of a nonvolatile semiconductor memory device according to a fourth embodiment is described with reference to FIG. 28. The fourth embodiment includes a memory block MB similar to that in the first embodiment, hence a description thereof is omitted.

The fourth embodiment is an example where two-dimensional matrix type steps as in the third embodiment are formed by executing the slimming system followed by the deposit system as in the second embodiment. As shown in FIG. 28, the fourth embodiment includes a stepped portion STc having steps STc(1,1)-STc (9,9) disposed in a matrix in the row direction and the column direction. The steps STc(1,1)-STc(9,9) are configured by the back gate conductive layer 31, the word line conductive layers 41a-41h, and the source side conductive layer 51a (drain side conductive layer 51b).

As shown in FIG. 28, the steps STc(1,1)-STc(9,9) are disposed, for example, from a lowermost layer to an uppermost layer, in a sequence STc(1,1), STc(1,2), . . . , STc(1, 9), STc(2, 1), . . . , STc(8, 9), STc(9, 1), . . . , STc(9,9). Hence, each step STc(i,j) is located in a different layer.

Moreover, row-direction widths Lcr(n) of the steps STc(1, n)-STc(9,n) are configured such that Lcr(1)>Lcr(2)>Lcr(3)>Lcr(4) and Lcr(5)<Lcr(6)<Lcr(7)<Lcr(8)<Lcr(9), and column-direction widths Lcc(n) of the steps STc(n,1)-STc(n,9) are configured such that Lcc(1)>Lcc(2)>Lcc(3)>Lcc(4) and Lcc(5)<Lcc(6)<Lcc(7)<Lcc(8)<Lcc(9).

[Method of Manufacturing]

Next, a method of manufacturing a nonvolatile semiconductor memory device according to the fourth embodiment is described. Note that in the fourth embodiment, only a process for forming the stepped portion STc is described.

First, similar processes to those in the second embodiment are employed to process the back gate conductive layer 31, the word line conductive layers 41a-41h, and the source side conductive layer 51a (drain side conductive layer 51b) into a stepped shape in the row direction. Then, similar processes to those in the second embodiment are employed to process the back gate conductive layer 31, the word line conductive layers 41a-41h, and the source side conductive layer 51a (drain side conductive layer 51b) into a stepped shape in the column direction. As a result, the stepped portion STc shown in FIG. 28 is formed.

As a result of forming the stepped portion STc in the above-described manner, it is possible in the fourth embodiment to secure a width enabling formation of the contact layers in the steps STc(1,1)-STc(9,9), even if variation in manufacturing processes causes the width of the steps STc(1,1)-STc(9,9) to be smaller than an anticipated value, similarly to in the second embodiment. Therefore, the fourth embodiment enables increase in wiring resistance to be suppressed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A three-dimensional semiconductor device, comprising:
a semiconductor substrate;
a plurality of conductive layers and insulating layers stacked alternately above the semiconductor substrate; and
a plurality of contacts extending in a stacking direction of the plurality of conductive layers and insulating layers,
the plurality of conductive layers forming a stepped portion having positions of ends of the plurality of conductive layers gradually shifted from an upper layer to a lower layer along steps of the stepped portion,
the plurality of contacts being connected respectively to each of the steps of the stepped portion, and
the stepped portion being formed such that, at least from an uppermost conductive layer to a certain conductive layer, the more upwardly the conductive layer is located, the broader a width of the step is.

2. The three-dimensional semiconductor device according to claim 1, wherein
the stepped portion is formed such that, regarding conductive layers in layers lower than the certain conductive layer, the more downwardly the conductive layer is located, the broader the width of the step is.

3. The three-dimensional semiconductor device according to claim 1, wherein
the steps of the stepped portion are arranged in a matrix in a first direction parallel to a main surface of the semiconductor substrate and a second direction parallel to the main surface of the semiconductor substrate and orthogonal to the first direction.

4. The three-dimensional semiconductor device according to claim 2, wherein
the steps of the stepped portion are arranged in a matrix in a first direction parallel to a main surface of the semiconductor substrate and a second direction parallel to the main surface of the semiconductor substrate and orthogonal to the first direction.

5. The three-dimensional semiconductor device according to claim 1, wherein
the contacts are formed in a tapered shape.

6. The three-dimensional semiconductor device according to claim 1, further comprising:
a memory cell array including a plurality of memory cells arranged three-dimensionally on the semiconductor substrate,
wherein the conductive layers are connected to the memory cell array.

7. A nonvolatile semiconductor memory device, comprising:
a semiconductor substrate; and
a memory string provided on the semiconductor substrate and including a plurality of memory cells connected in series,
the memory string comprising:
a semiconductor layer extending in a perpendicular direction to a main surface of the semiconductor substrate and functioning as a body of the memory cells;
a charge storage layer provided on a side surface of the semiconductor layer and configured to store a charge;
a plurality of conductive layers extending in the perpendicular direction to the main surface of the semiconductor substrate via insulating layers, each of the conductive layers sandwiching the charge storage layer between the conductive layer and the semiconductor layer and functioning as a gate of the memory cells; and
a plurality of contacts extending in the perpendicular direction to the main surface of the semiconductor substrate and connected to ends of the conductive layers,
the plurality of conductive layers including a stepped portion having positions of ends of the plurality of conductive layers gradually shifted from an upper layer to a lower layer along steps of the stepped portion,
the plurality of contacts being connected respectively to each of the steps of the stepped portion, and
the stepped portion being formed such that, at least from an uppermost conductive layer to a certain conductive layer, the more upwardly the conductive layer is located, the broader a width of the step is.

8. The nonvolatile semiconductor memory device according to claim 7, wherein
the stepped portion is formed such that, regarding conductive layers in layers lower than the certain conductive layer, the more downwardly the conductive layer is located, the broader the width of the step is.

9. The nonvolatile semiconductor memory device according to claim 7, wherein
the steps of the stepped portion are arranged in a matrix in a first direction parallel to the main surface of the semiconductor substrate and a second direction parallel to the main surface of the semiconductor substrate and orthogonal to the first direction.

10. The nonvolatile semiconductor memory device according to claim 8, wherein
the steps of the stepped portion are arranged in a matrix in a first direction parallel to the main surface of the semiconductor substrate and a second direction parallel to the main surface of the semiconductor substrate and orthogonal to the first direction.

11. The nonvolatile semiconductor memory device according to claim 7, wherein
the contacts are formed in a tapered shape.

12. The nonvolatile semiconductor memory device according to claim 8, wherein
the contacts are formed in a tapered shape.

13. The nonvolatile semiconductor memory device according to claim 7, wherein
the semiconductor layer comprises:
a pair of columnar semiconductor layers extending in the perpendicular direction to the main surface of the semiconductor substrate; and
a joining semiconductor layer configured to join lower ends of the pair of columnar semiconductor layers.

14. A method of manufacturing a three-dimensional semiconductor device, comprising:
stacking a plurality of conductive layers and insulating layers alternately on a semiconductor substrate;
forming a resist on a stacked body of the conductive layers and the insulating layers;
executing sequentially a selective etching of the conductive layers and the insulating layers by the resist while reducing the resist, thereby forming a stepped portion having positions of ends of the plurality of conductive layers gradually shifted from an upper layer to a lower layer along steps of the stepped portion; and
connecting contacts respectively to each of the steps of the stepped portion, the contacts extending in a stacking direction,
formation of the stepped portion being executed while adjusting a reduction width of the resist such that, at least from an uppermost layer to a certain conductive layer, the more upwardly the conductive layer is located, the broader a width of the step is.

15. The method of manufacturing a three-dimensional semiconductor device according to claim 14, wherein
formation of the stepped portion comprises:
at least from the uppermost layer to the certain conductive layer, executing sequentially a selective etching of the conductive layers and the insulating layers by the resist while reducing the resist, thereby forming the stepped portion having positions of ends of the plurality of conductive layers gradually shifted from an upper layer to a lower layer; and,
regarding from the certain conductive layer to a lowermost conductive layer, executing sequentially a selective etching of the conductive layers and the insulating layers by the resist while performing an additional application of the resist to increase a range of the resist, thereby forming the stepped portion having positions of ends of the plurality of conductive layers gradually shifted from an upper layer to a lower layer.

16. The method of manufacturing a three-dimensional semiconductor device according to claim 14, wherein
formation of the stepped portion comprises:
forming a one-dimensional stepped portion having positions of ends of the plurality of conductive layers gradually shifted in a first direction from an upper layer to a lower layer; and,
after forming the one-dimensional stepped portion, forming a two-dimensional stepped portion having the one-dimensional stepped portion gradually shifted in a second direction orthogonal to the first direction from an upper layer to a lower layer.

17. The method of manufacturing a three-dimensional semiconductor device according to claim 15, wherein
formation of the stepped portion comprises:
forming a one-dimensional stepped portion having positions of ends of the plurality of conductive layers gradually shifted in a first direction from an upper layer to a lower layer; and,
after forming the one-dimensional stepped portion, forming a two-dimensional stepped portion having the one-dimensional stepped portion gradually shifted in a second direction orthogonal to the first direction from an upper layer to a lower layer.

18. The method of manufacturing a three-dimensional semiconductor device according to claim 14, wherein
formation of the stepped portion comprises
increasing the reduction width of the resist by 10% or more over the reduction width of the resist in an immediately prior process.

19. The method of manufacturing a three-dimensional semiconductor device according to claim 15, wherein
formation of the stepped portion comprises
increasing the reduction width of the resist by 10% or more over the reduction width of the resist in an immediately prior process.

20. The method of manufacturing a three-dimensional semiconductor device according to claim 14, further comprising:
forming a contact on each of the steps of the stepped portions, the contact having a tapered shape and extending in the stacking direction.

* * * * *